United States Patent
Mathe et al.

(10) Patent No.: US 7,791,520 B2
(45) Date of Patent: Sep. 7, 2010

(54) LOW POWER, LOW NOISE DIGITAL-TO-ANALOG CONVERTER REFERENCE CIRCUIT

(75) Inventors: Lennart K-A Mathe, San Diego, CA (US); Xiaohong Quan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 37 days.

(21) Appl. No.: 12/027,226

(22) Filed: Feb. 6, 2008

(65) Prior Publication Data

US 2009/0009375 A1  Jan. 8, 2009

Related U.S. Application Data

(60) Provisional application No. 60/945,309, filed on Jun. 20, 2007, provisional application No. 60/913,499, filed on Apr. 23, 2007.

(51) Int. Cl.
*H03M 1/66* (2006.01)
(52) U.S. Cl. .............................. 341/150; 381/120
(58) Field of Classification Search .......... 351/144–155; 327/536; 381/120
See application file for complete search history.

(56) References Cited

U.S. PATENT DOCUMENTS

| | | | |
|---|---|---|---|
| 5,625,360 A * | 4/1997 | Garrity et al. ............... | 341/144 |
| 6,919,833 B2 * | 7/2005 | Mills ........................... | 341/144 |
| 7,142,143 B2 | 11/2006 | Draxelmayr | |
| 2005/0206543 A1 * | 9/2005 | Draxelmayr ................ | 341/143 |
| 2008/0150619 A1 * | 6/2008 | Lesso et al. ................. | 327/536 |
| 2008/0150620 A1 * | 6/2008 | Lesso ......................... | 327/536 |
| 2008/0150621 A1 * | 6/2008 | Lesso et al. ................. | 327/536 |
| 2008/0159567 A1 * | 7/2008 | Lesso et al. ................. | 381/120 |

FOREIGN PATENT DOCUMENTS

WO  0128103  4/2001

OTHER PUBLICATIONS

International Search Report—PCT/US08/060762, International Search Authority—European Patent Office, Sep. 10, 2008.
Written Opinion—PCT/US08/060762, International Search Authority—European Patent Office, Sep. 10, 2008.

* cited by examiner

*Primary Examiner*—Lam T Mai
(74) *Attorney, Agent, or Firm*—Jiayu Xu

(57) ABSTRACT

The present patent application comprises a digital to analog converter reference circuit, comprising a capacitor connected to a current source, a positive terminal of the capacitor connected to a first switch, the first switch electrically connecting the positive terminal of the capacitor to a positive input terminal of a DAC circuit, a negative terminal of the capacitor connected to a second switch, the second switch electrically connecting the negative terminal of the capacitor to a negative input terminal of the DAC circuit. In another example, the present patent application comprises a method for converting digital code to an analog signal, comprising charging a reservoir capacitor to a reference voltage level, transferring stored charge from the reservoir capacitor to DAC feedback capacitors, and transferring the stored charge from the DAC feedback capacitors to DAC output terminals.

25 Claims, 19 Drawing Sheets

DAC Reference Circuit Current Flow Diagram During Reservoir Capacitor Charging Phase (Phase 1)

DAC Reference Circuit Utilizing Current Source Reference Circuits and Resistor Network

LOW POWER, LOW NOISE DIGITAL-TO-ANALOG CONVERTER REFERENCE CIRCUIT

CLAIM OF PRIORITY UNDER 35 U.S.C §119

The present application for patent claims priority to U.S. Provisional Application No. 60/945,309 titled "Low Power, Low Noise DAC Reference Circuit for use in a Delta Sigma ADC" filed Jun. 20, 2007 and U.S. Provisional Application No. 60/913,499 titled "DAC Reference Circuit for use in a Delta Sigma ADC" filed Apr. 23, 2007, both assigned to the assignee hereof and expressly incorporated herein by reference.

BACKGROUND

1. Field

The present application pertains generally to digital-to-analog converters (DAC) circuits, and more specifically, to low power, low noise digital-to-analog converter reference circuits.

2. Background

Digital-to-analog converter circuits are utilized in many modern communication systems. For example, different circuits such as Delta-sigma modulators and Pipeline analog-to-digital converters may include digital-to-analog converts (DAC or D-to-A) in the feedback path. DAC circuits may consume a large amount of power during operation to achieve high speed linear operation. As new multi-standard compliant requirements are set, such as in the third generation (3G) standard (e.g. Enhanced Data rates for GSM Evolution (EDGE), Wideband Code Division Multiple Access (WCDMA), Code Division Multiple Access (CDMA2000), and Universal Mobile Telecommunications System (UMTS)), and Universal Mobile Telecommunications System (UMTS)), the complexity, size and power consumption of the radio frequency (RF) and baseband devices have greatly increased. In order to process the RF and baseband signals in the digital domain there is a need to convert the incoming analog signals into digital signals as close as possible to the receiving antenna. However, in order for the small desired signal to be distinguished from blockers and interferers, an analog-to-digital converter (ADC) with a high dynamic range is required.

In modern mobile communication devices power consumption is a concern because an increase in power consumption may cause a decrease in battery life of the mobile device. Noise performance is also a concern in modern mobile communication devices to ensure reliable quality communications. Therefore there is a need for a low power, low noise digital-to-analog converter reference circuit for use in a digital-to-analog converter circuits.

SUMMARY

In view of the above, the described features of the present invention generally relate to one or more improved systems, methods and/or apparatuses for data communication devices. In one embodiment, the present patent application comprises a method and apparatus to implement a low noise, low power consumption digital-to-analog converter reference circuit.

Further scope of the applicability of the present method and apparatus will become apparent from the following detailed description, claims, and drawings. However, it should be understood that the detailed description and specific examples, while indicating preferred embodiments of the invention, are given by way of illustration only, since various changes and modifications within the spirit and scope of the invention will become apparent to those skilled in the art.

The present patent application comprises a digital to analog converter reference circuit, comprising a capacitor connected to a current source, a positive terminal of said capacitor connected to a first switch, said first switch electrically connecting said positive terminal of said capacitor to a positive input terminal of a DAC circuit, a negative terminal of said capacitor connected to a second switch, said second switch electrically connecting said negative terminal of said capacitor to a negative input terminal of said DAC circuit.

In another example, the present patent application comprises a method for converting digital code to an analog signal, comprising charging a reservoir capacitor to a reference voltage level, transferring stored charge from said reservoir capacitor to digital-to-analog converter (DAC) feedback capacitors, and transferring said stored charge from said DAC feedback capacitors to DAC output terminals.

BRIEF DESCRIPTION OF THE DRAWINGS

The features, objects, and advantages of the presently disclosed method and apparatus will become more apparent from the detailed description set forth below when taken in conjunction with the drawings in which like reference characters identify correspondingly throughout and wherein.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other embodiments. The detailed description includes specific details for the purpose of providing a thorough understanding of the present invention. However, it will be apparent to those skilled in the art that the present invention may be practiced without these specific details. In some instances, well known structures and devices are shown in block diagram form in order to avoid obscuring the concepts of the present invention.

Figure 1:
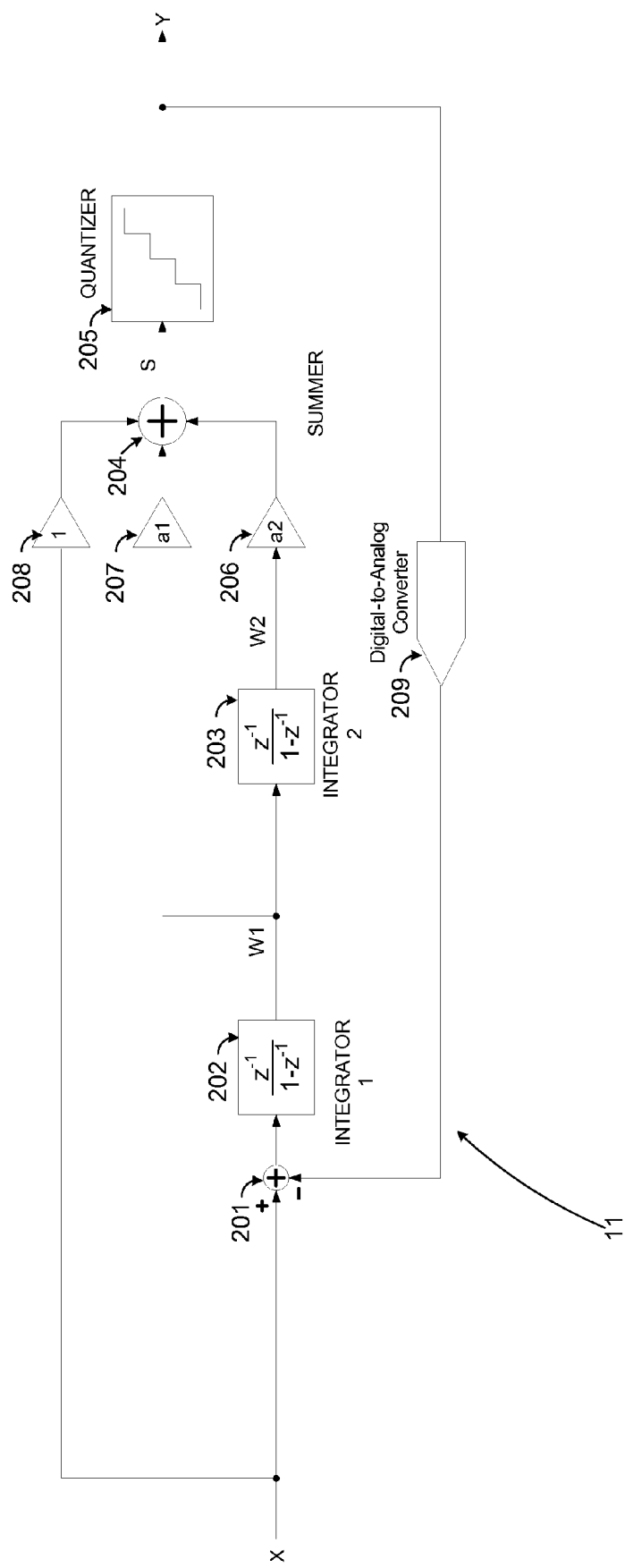
FIG. 1 shows an exemplary delta-sigma modulator utilizing a digital-to-analog converter circuit 209 to provide feedback to the input of the delta-sigma analog-to-digital converter 11.

FIG. 1 shows a delta-sigma analog-to-digital converter utilizing a DAC circuit in the feedback path. Digital-to-analog converter circuits may be used in delta-sigma analog-to-digital converters (ADC) to provide feedback to the input of the delta-sigma modulator. However, it is noted that one skilled in the art will realize that the improved methods and apparatuses for implementing a DAC reference circuit may be used in any DAC circuit.

A digital-to-analog converter (DAC or D-to-A) is used to convert a digital (usually binary) code to an analog signal. The analog signal may take the form of a current, voltage or electric charge. A digital-to-analog converter circuit may use a reference circuit and an operational transconductance amplifier (OTA) 601. DAC reference circuits may consume a large amount of power to provide complete and accurate charging of the DAC capacitors. Therefore, there is a need to implement a low noise, low power consumption digital-to-analog converter reference circuit.

The present embodiment provides various design techniques to implement a low noise, low power consumption digital-to-analog converter reference circuit.

Figure 2:
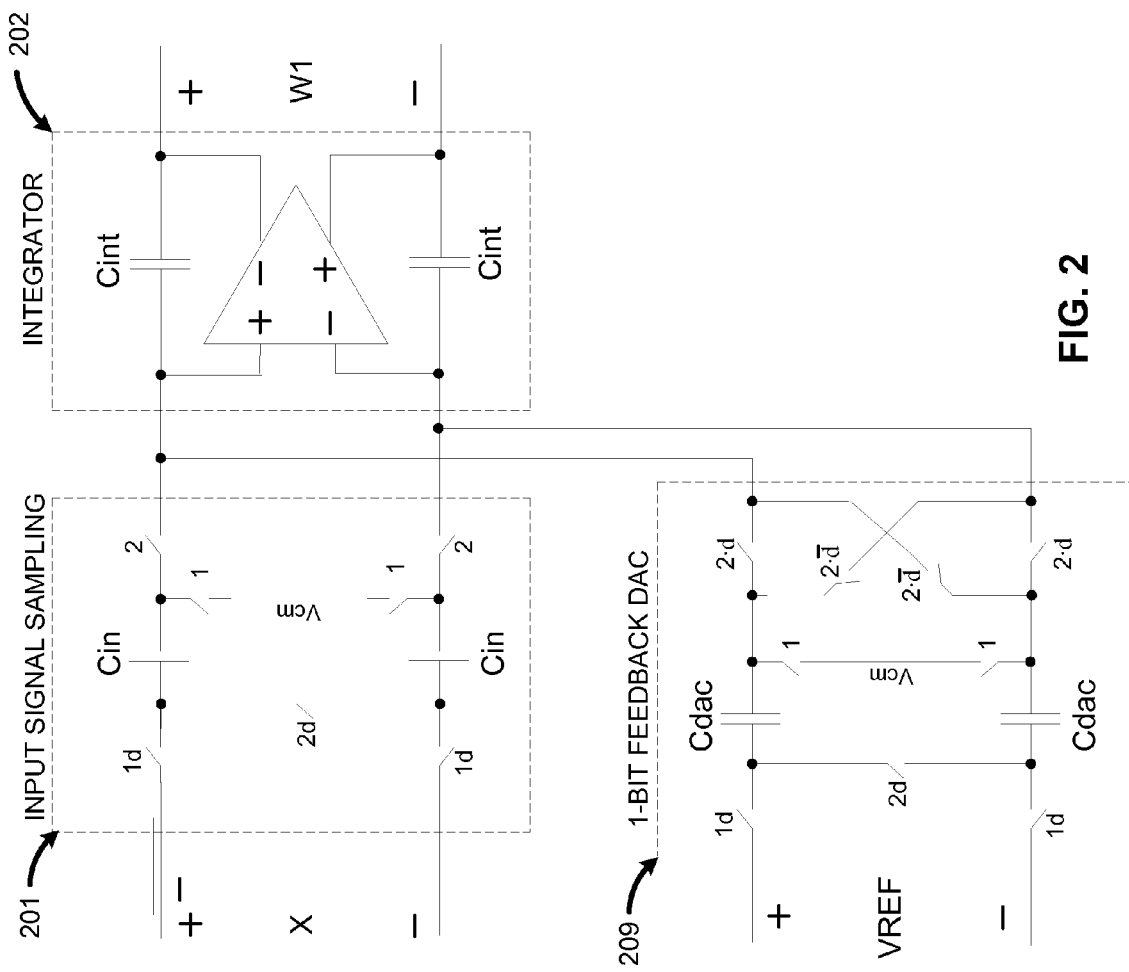
FIG. 2 shows an exemplary switched capacitor integrator, which may be the first stage in a delta sigma ADC circuit.

FIG. 2 shows an exemplary switched capacitor integrator circuit, which may be the first stage in a delta sigma ADC circuit shown in FIG. 1.

Figure 3:
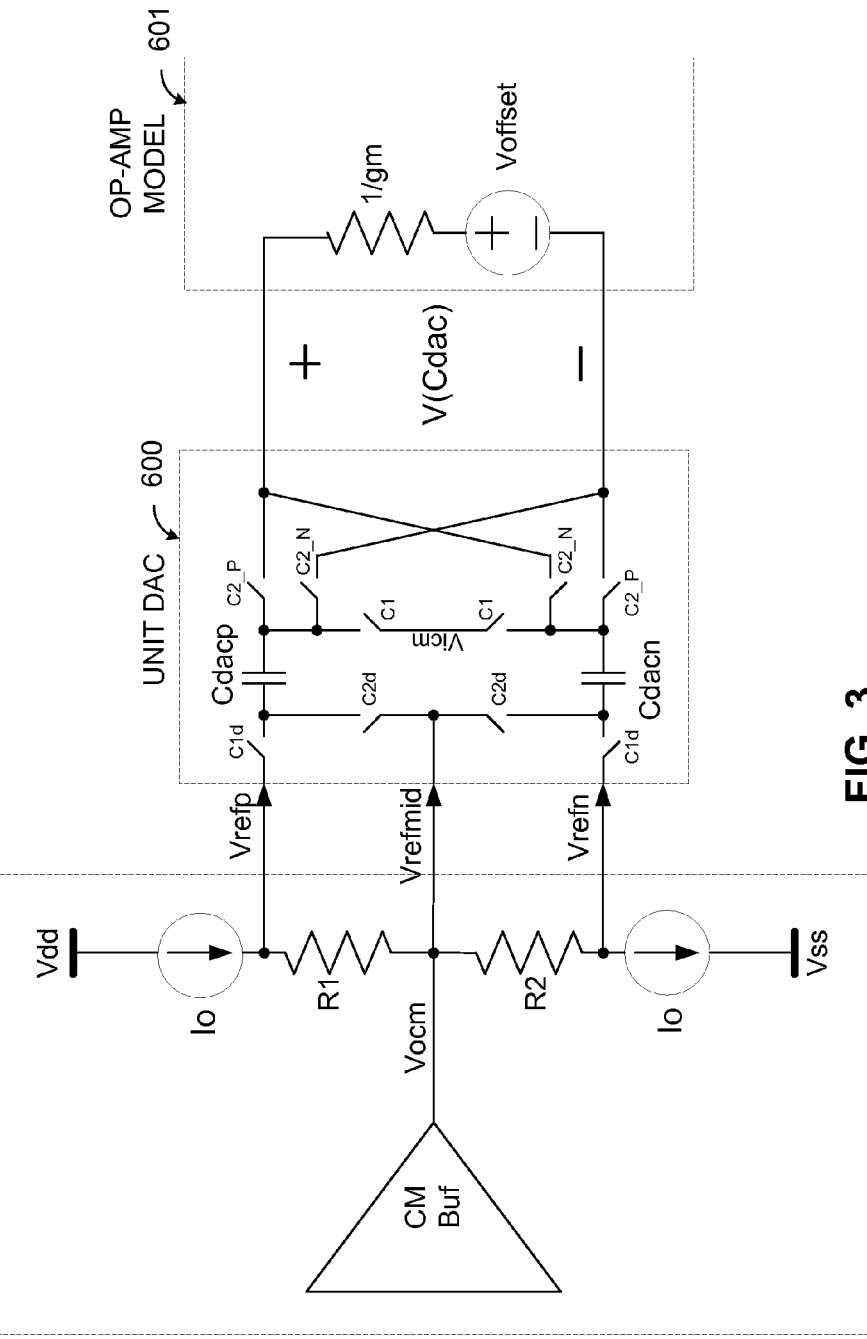
FIG. 3 shows a reference DAC circuit comprising a differential current source connected to a series resistive network.
Figure 14:
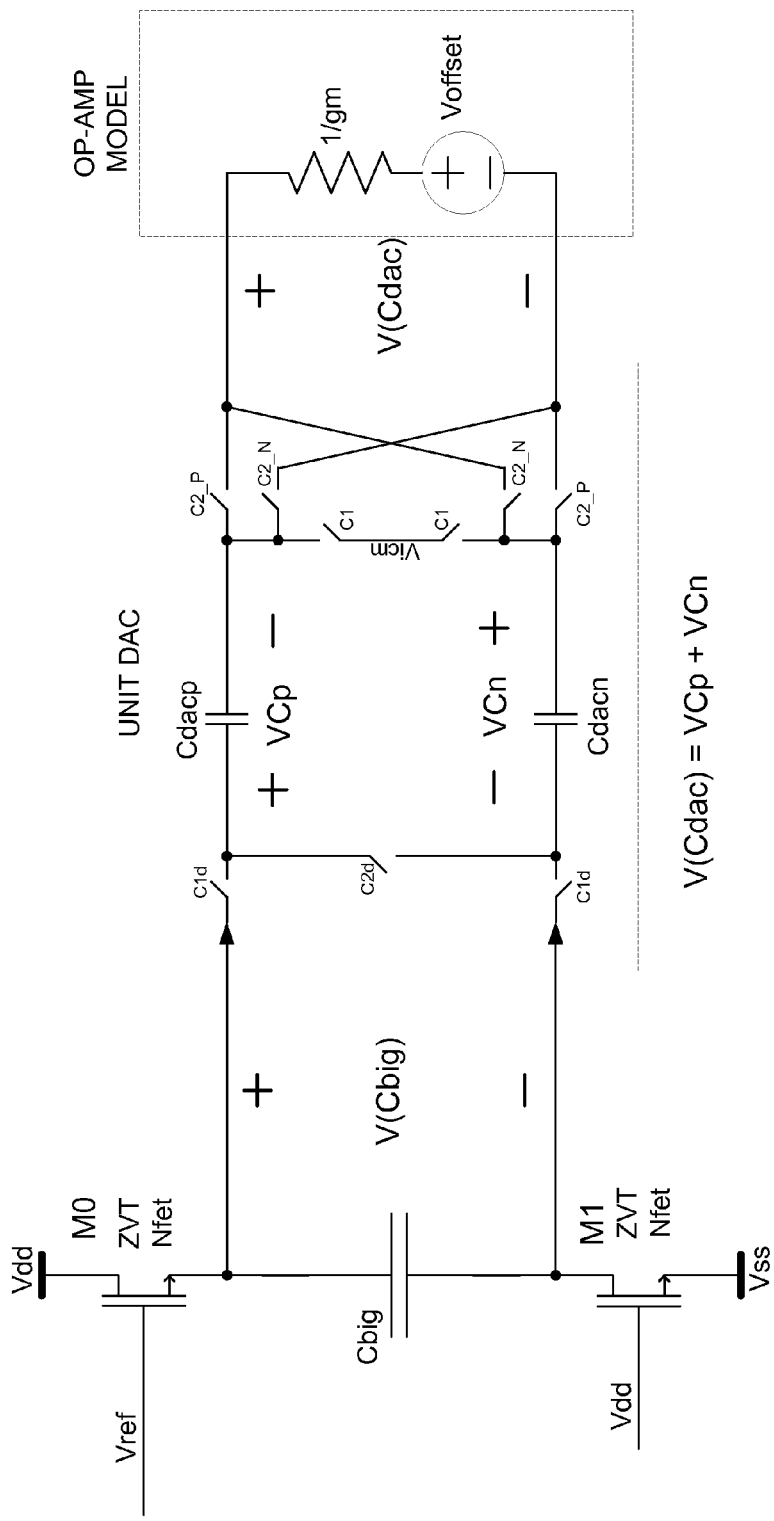
FIG. 14 shows a zero-VT NFET transistor source follower that is biased with very low bias current so its output impedance is large and it in effect acts as a current source.
Figure 15:
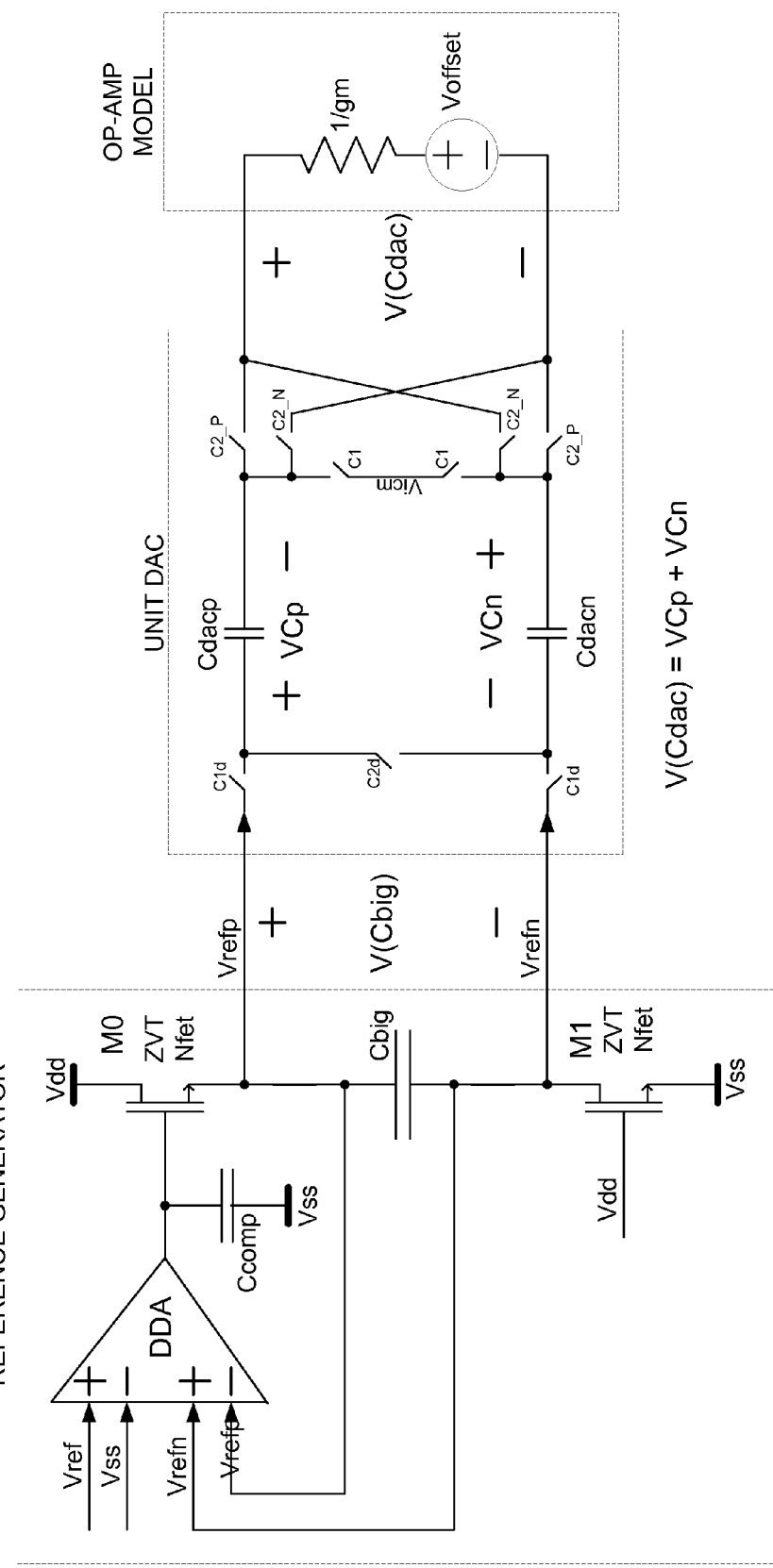
FIG. 15 shows improved method and apparatus for implementing a current source within a DAC reference circuit for use in a delta-sigma ADC comprising a slow feedback loop.
Figure 16:
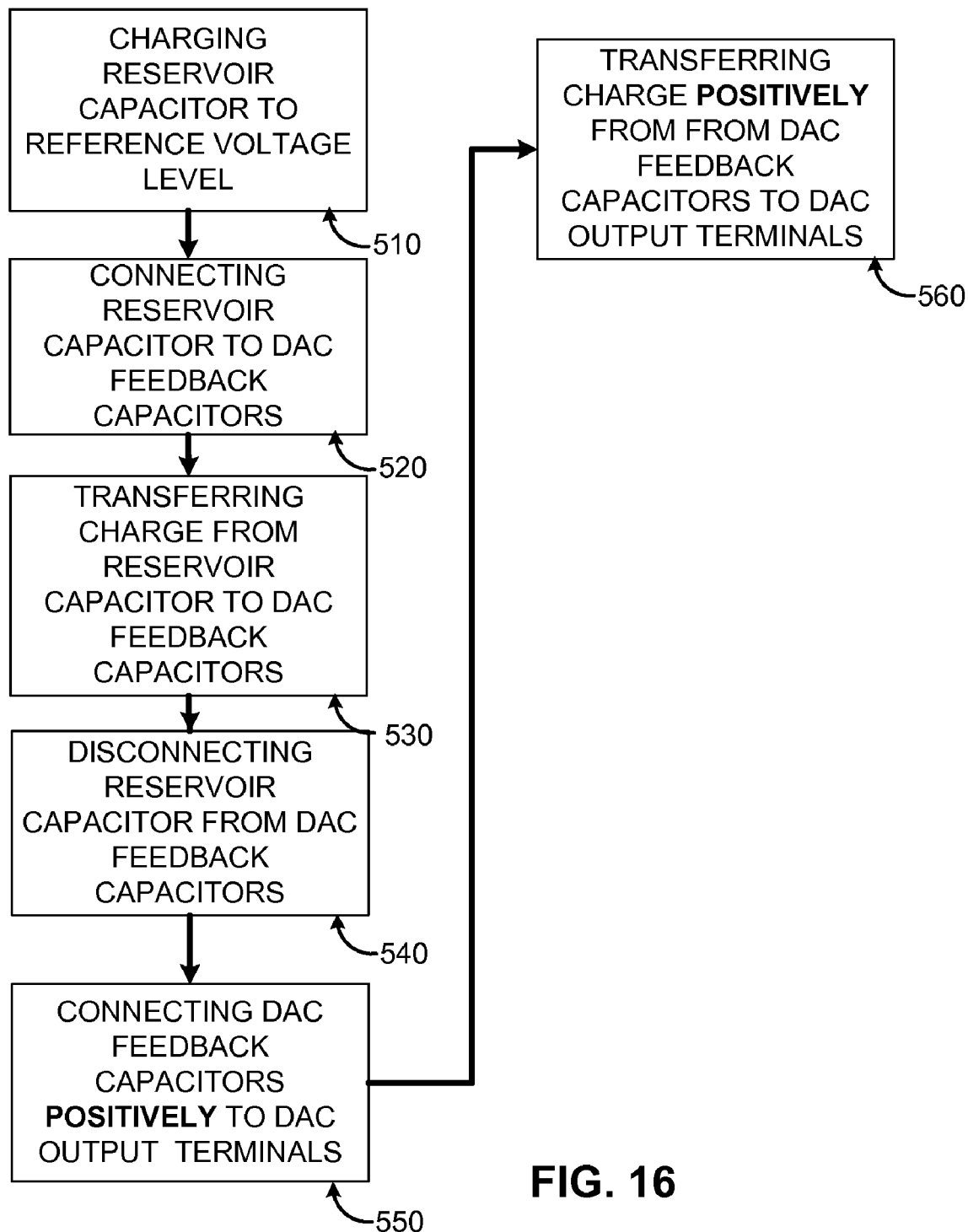
FIG. 16 is a flow chart of a DAC reference circuit operation when the feedback value is +1.

FIG. 3 shows a reference DAC circuit comprising a differential current source connected to a series resistive network. It is noted that the OTA circuit 601 shown in FIG. 3 is a simplified representation of the complete integrator circuit 202 shown in FIG. 2. In multiple examples, the current source may be implemented with Metal Oxide Semiconductor Field Effect Transistors (MOSFET) as shown in FIGS. 14-16. The current source supplies a direct current (DC) which flows through series resistors R1 and R2. The current multiplied by resistance through which it travels is the voltage drop across the resistor. Resistors R1 and R2 create the voltage difference between reference voltages Vrefp, Vrefmid, and Vrefn. For example, the settled reference voltage created across R1 is $V_{refp} - V_{refmid}$ which may be expressed as:

$$V_{refp} - V_{refmid} = (I_0 \cdot R1) \quad \text{Eq (1)}$$

Likewise the reference voltage created across R2 is $V_{refmid} - V_{refn}$ which may be expressed as:

$$V_{refmid} - V_{refn} = (I_0 \cdot R2) \quad \text{Eq (2)}$$

Switches C1, C1d, C2d, C2_P, and C2_N are utilized to first apply charge to capacitors $C_{dacp}$ and $C_{dacn}$. Once feedback DAC capacitors $C_{dacp}$ and $C_{dacn}$ sufficiently charged switches C1, C1d, C2d, C2_P, and C2_N are utilized to provide the stored charge to an integrating capacitor by use of an OTA 601, which is modeled using the 1/gm resistor and the offset voltage source connected to the output of the UNIT DAC. As shown in FIG. 3, this integration can be positively applied to the integrating OTA 601 by closing switch C2_P and opening switch C2_N. Alternatively, this integration can be negatively applied to the integrating OTA 601 by closing switch C2_N and opening switch C2_P. Capacitors $C_{dacp}$ and $C_{dacn}$ may have the same capacitance value so that the capacitance measured at the UNIT DAC output terminal $C_{dac}$ will be ½ of a single feedback capacitor value. The circuit configuration shown in FIG. 3 implements a 2-level DAC.

One skilled in the art will realize this circuit configuration can be extended to more DAC levels by connecting additional UNIT DACs in parallel which are controlled by different C2_P and C2_N clocks.

Switch control clock signals for switches C1, C1d, C2d, C2_P, and C2_N of FIG. 3 are shown in FIG. 14 based on a digital feedback sequence of +1, −1, −1 from the quantizer circuit 205. A high signal on the switch control signal chart indicates that the corresponding switch is in an electrically connected state, or as commonly referenced "closed". A low signal on the switch control signal chart indicates that the corresponding switch is in an electrically disconnected state, or as commonly referenced "open".

During phase 1 of the first sample period when the feedback is +1 is shown in FIG. 14. During this phase switches C1 and C1d are closed and switches C2d, C2_P, and C2_N are open. This switching configuration charges capacitors $C_{dacp}$ and $C_{dacn}$. In phase 2 of the first sampling period when capacitors $C_{dacp}$ and $C_{dacn}$ are sufficiently charged, switches C1 and C1d are opened and switches C2d and C2_P are closed. This switching configuration positively applies the charge stored in capacitors $C_{dacp}$ and $C_{dacn}$ to the integrating OTA 601 circuit.

During phase 1 of the second sampling period when the feedback value is −1 is shown in FIG. 14. During this phase switches C1 and C1d are closed and switches C2d, C2_P, and C2_N are open. This switching configuration charges capacitors $C_{dacp}$ and $C_{dacn}$. In phase 2 of the second sampling period when capacitors $C_{dacp}$ and $C_{dacn}$ are sufficiently charged, switches C1 and C1d are opened and switches C2d and C2_N are closed. This switching configuration negatively applies the charge stored in capacitors $C_{dacp}$ and $C_{dacn}$ to the integrating OTA 601 circuit. This sequence of switching is repeated in third sample period because the digital feedback signal during this period is also −1.

A high dynamic range ADC may have large feedback capacitors $C_{dacp}$ and $C_{dacn}$ to provide large amounts of charge quickly. Large feedback capacitors $C_{dacp}$ and $C_{dacn}$ may cause a large resistor capacitor time constant and thus limiting the sampling rate of the ADC circuit. To decrease the resistor capacitor time constant, very low resistance value resistors may be used for R1 and R2. However, the use of low resistance values may cause the ADC circuit to suffer an increase in power consumption and degradation in noise performance. For example, if the resistance value is reduced by a factor of ten the current reference may be increased by a factor of ten to maintain the same reference voltage $V_{refp}$. The relationship between resistance, current and power consumption may be expressed by:

$$\text{Power} = I_0^2 R \qquad \text{Eq (3)}$$

Therefore, if the current is increased by ten percent to compensate for the ten percent reduction in resistance the overall power consumption would be increased by approximately 9 percent. Moreover, an increase in the reference current may cause the reference circuit to inject additional noise into the circuit and thus reducing the noise performance of the circuit.

Figure 4:
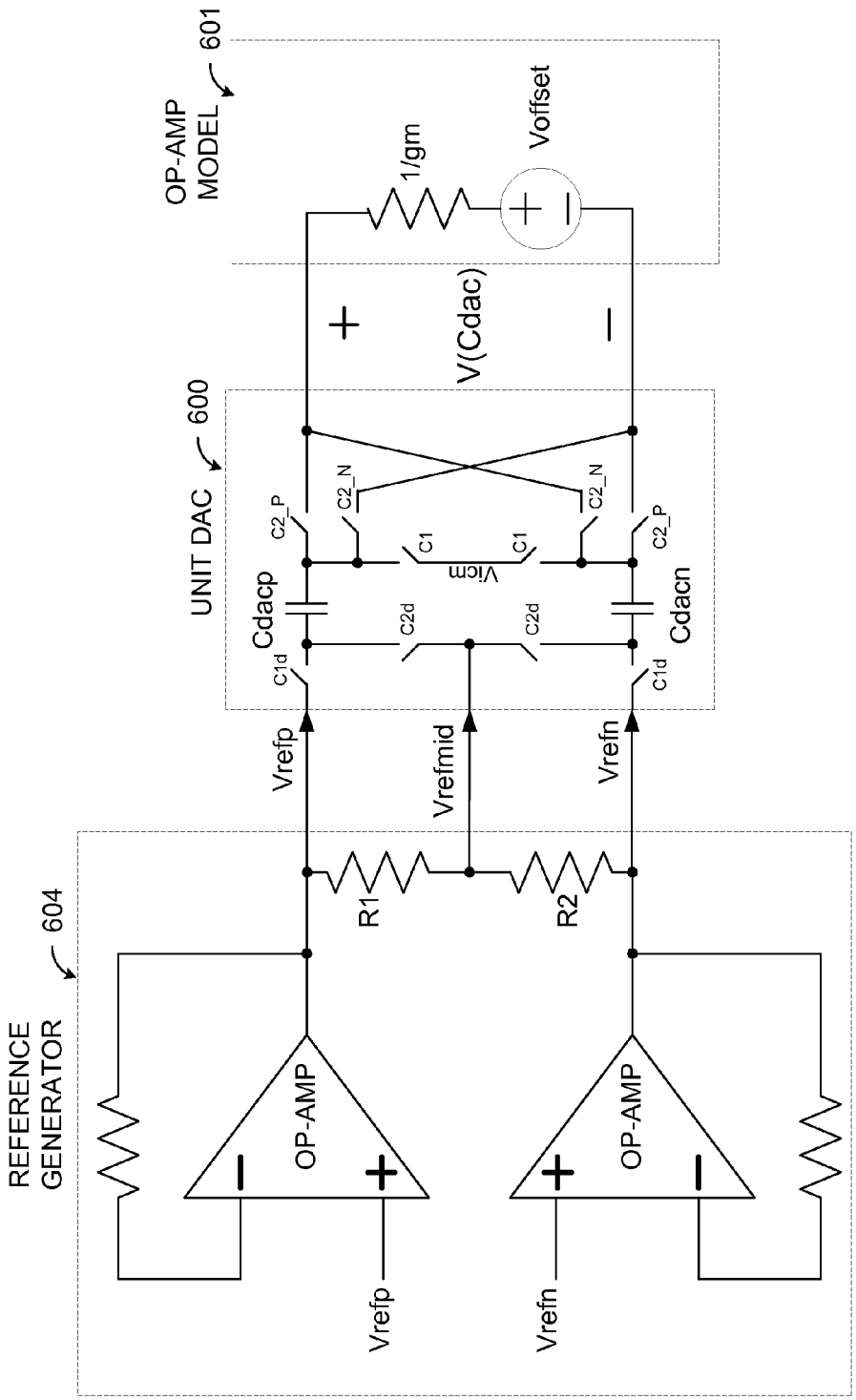
FIG. 4 shows a reference DAC circuit comprising 2 OP-amps in feedback connected to a series resistive network.

FIG. 4 shows a reference DAC circuit comprising 2 voltage sources connected to a series resistive network. The voltage sources set the positive reference voltage $V_{refp}$ and the negative reference voltage $V_{refn}$ using a voltage follower configuration. Resistors R1 and R2 are connected in series between both reference voltage supplies. A DC current is induced through resistors R1 and R2, which may be express as:

$$I_0 = \frac{V_{refp} - V_{refn}}{R1 + R2} \qquad \text{Eq (4)}$$

The current multiplied by resistance voltage drop across the resistors R1 and R2 create the voltage difference between reference voltages $V_{refp}$, $V_{refmid}$, and $V_{refn}$. For example, the reference voltage created across R1 is $V_{refp} - V_{refmid}$ which may be expressed as:

$$V_{refp} - V_{refmid} = (I_0 \cdot R1) \qquad \text{Eq (5)}$$

Likewise the reference voltage created across R2 is $V_{refmid} - V_{refn}$ which may be expressed as:

$$V_{refmid} - V_{refn} = (I_0 \cdot R2) \qquad \text{Eq (6)}$$

Switches C1, C1d, C2d, C2_P, and C2_N are utilized to first apply charge to capacitors $C_{dacp}$ and $C_{dacn}$. Once capacitors $C_{dacp}$ and $C_{dacn}$ sufficiently charged switches C1, C1d, C2d, C2_P, and C2_N are utilized to provide the stored charge to an integrating capacitor by use of an OTA 601, which is modeled using the 1/gm resistor and the offset voltage connected to the output of the UNIT DAC. As shown in FIG. 4, this integration can be positively applied to the integrating OTA 601 by closing switch C2_P and opening switch C2_N. Alternatively, this integration can be negatively applied to the integrating OTA 601 by closing switch C2_N and opening switch C2_P. Capacitors $C_{dacp}$ and $C_{dacn}$ may both have the same capacitance value so that the capacitance measured at the UNIT DAC output terminal $C_{dac}$ will be ½ of a single feedback capacitor value.

This circuit configuration implements a 2-level DAC. One skilled in the art will realize this circuit configuration can be extended to more DAC levels by connecting more UNIT DACs in parallel which are controlled by different C2_P and C2_N clocks.

Switch control clock signals for switches C1, C1d, C2d, C2_P, and C2_N of FIG. 4 are shown in FIG. 14 based on a digital feedback sequence of [+1, −1, −1] from the quantizer circuit 205 shown in FIG. 1. A high signal on the switch control signal chart indicates that the corresponding switch is in an electrically connected state, or as commonly referenced "closed". A low signal on the switch control signal chart indicates that the corresponding switch is in an electrically disconnected state, or as commonly referenced "open".

During phase 1 of the first sample period when the feedback is +1 is shown in FIG. 14. During this phase switches C1 and C1d are closed and switches C2d, C2_P, and C2_N are open. This switching configuration charges capacitors $C_{dacp}$ and $C_{dacn}$. In phase 2 of the first sampling period when capacitors $C_{dacp}$ and $C_{dacn}$ are sufficiently charged, switches C1 and C1d are opened and switches C2d and C2_P are closed. This switching configuration positively applies the charge stored in capacitors $C_{dacp}$ and $C_{dacn}$ to the integrating OTA 601 circuit.

During phase 1 of the second sampling period when the feedback value is −1 is shown in FIG. 14. During this phase switches C1 and C1d are closed and switches C2d, C2_P, and C2_N are open. This switching configuration charges capacitors $C_{dacp}$ and $C_{dacn}$. In phase 2 of the second sampling period when capacitors $C_{dacp}$ and $C_{dacn}$ are sufficiently charged, switches C1 and C1d are opened and switches C2d and C2_N are closed. This switching configuration negatively applies the charge stored in capacitors $C_{dacp}$ and $C_{dacn}$ to the integrating OTA 601 circuit. This sequence of switching is repeated in third sample period because the digital feedback signal during this period is also −1.

Figure 5:
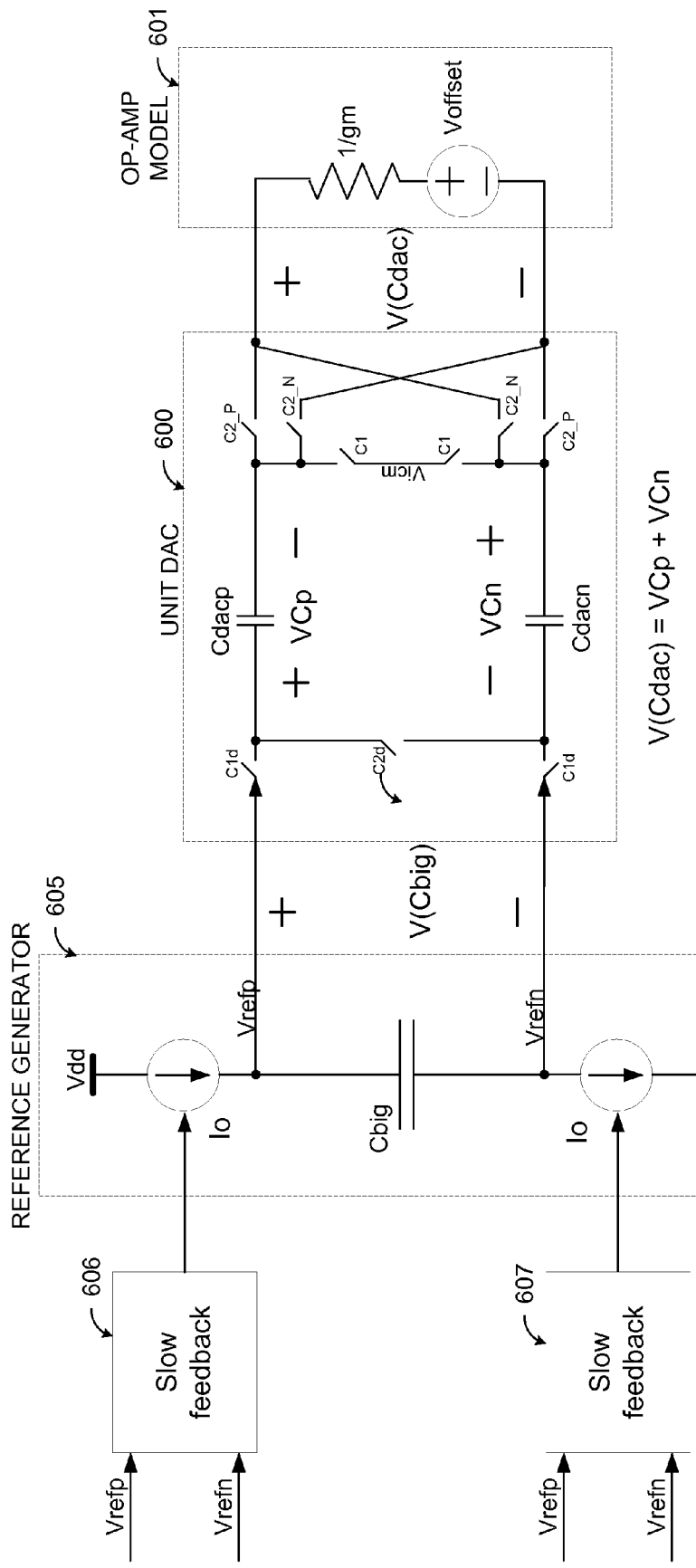
FIG. 5 shows an improved method and apparatus for implementing a DAC reference circuit for use in a delta-sigma ADC comprising a "reservoir" capacitor $C_{big}$.

FIG. 5 discloses an improved method and apparatus for implementing a DAC reference circuit for use in a delta-sigma ADC comprising a "reservoir capacitor" $C_{big}$. $C_{big}$ is herein referred to as a "reservoir capacitor" because this capacitor acts as a reservoir of electrical charge. The reservoir capacitor is charged so to be able to provide a large amount of charge during short duration when desired. This event is herein referred to as the "charge sharing". In the present patent application, charge sharing is used to provide charge to capacitors $C_{dacp}$ and $C_{dacn}$ from the reservoir capacitor $C_{big}$. This improved method and apparatus may provide the advantage of reducing both power consumption and the noisefloor compared to the resistive solution shown in FIG. 3 and FIG. 4, because the series resistive network is replaced with the reservoir capacitor $C_{big}$.

The reservoir capacitor $C_{big}$ may be larger than feedback capacitors to ensure it can store enough electric charge to supply the electric charge required to charge both capacitors $C_{dacp}$ and $C_{dacn}$ without suffering a significant drop in voltage across $C_{big}$. The capacitors $C_{dacp}$ and $C_{dacn}$ combine in series to form the UNIT DAC output capacitance value $C_{dac}$. The reservoir capacitor $C_{big}$ is continuously charged to a desired voltage level by differential DC current source Io. To ensure the average voltage across the reservoir capacitor $C_{big}$ is maintained at the desired value slow feedback circuits 606 and 607, based on reference voltages $V_{refp}$ and $V_{refn}$, may be used to adjust differential current source Io. The reference voltage may be calculated as follows:

$V(nT^-)$ = Voltage across Cbig just before charge sharing event $V(nT^+)$ = Voltage across Cbig just after charge sharing event $V(nT + T/2) =$ Voltage across Cbig after clock phase1 but before clock phase2

-continued $V(nT + T^-) =$ Voltage across $C_{big}$ just before charge sharing event at the next cycle $$V(nT^+) = V(nT^-) \cdot \frac{C_{BIG}}{C_{BIG} + C_{DAC}} \quad \begin{pmatrix} \text{Charge sharing equation} \\ \text{in begining} \\ \text{of clock } phase1 \end{pmatrix}$$

$$V(nT + T/2) = V(nT^+) + \frac{I_0}{C_{BIG} + C_{DAC}} \cdot \frac{T}{2} \quad \begin{pmatrix} \text{Slow charge of both} \\ \text{caps during clock} \\ phase1 \end{pmatrix}$$

$$V(nT + T^-) = V(nT + T/2) + \frac{I_0}{C_{BIG}} \cdot \frac{T}{2} \quad \begin{pmatrix} \text{Slow charge of } Cbig \\ \text{during clock } phase2 \end{pmatrix}$$

$$V(nT + T^-) = V(nT^-) \quad \begin{pmatrix} \text{This must be true for} \\ \text{steady state solution} \end{pmatrix}$$

We now have 4 equations with 4 unknowns $V(nT + T/2)$ is the voltage level sampled by $C_{DAC}$. Solving the set of equations for $V(nT + T/2)$ yields:

$$V_{ref} = V(nT + T/2) = \frac{I_0}{F_S \cdot C_{DAC}}$$

where $F_S = 1/T$ is the sample rate

When switches C1, C1d, C2d, C2_P, and C2_N are opened the reservoir capacitor $C_{big}$ is charged to the reference voltage, which may be express as:

$$V_{Cbig} = V_{refp} - V_{refn} \quad \text{Eq (7)}$$

When $C_{big}$ is charged to the desired reference voltage level, the switches may be used to transfer the charge stored in reservoir capacitor $C_{big}$ to capacitors $C_{dacp}$ and $C_{dac}$. It is noted that reservoir capacitor $C_{big}$ is continuously charged before, during and after the charge sharing event. Once capacitors $C_{dacp}$ and $C_{dacn}$ are sufficiently charged, switches C1, C1d, C2d, C2_P, and C2_N are utilized to provide the stored charge to an integrating capacitor by use of an OTA 601, which is modeled using the 1/gm resistor in series with an offset voltage source connected to the output of the UNIT DAC. As shown in FIG. 5, this integration can be positively applied to the integrating OTA 601 by closing switch C2_P and opening switch C2_N. Alternatively, this integration can be negatively applied to the integrating OTA 601 by closing switch C2_N and opening switch C2_P. This circuit configuration implements a 2-level DAC. One skilled in the art will realize this circuit configuration may be extended to additional DAC levels by connecting more UNIT DACs in parallel which are controlled by different C2_P and C2_N clocks.

Capacitors $C_{dacp}$ and $C_{dacn}$ may both have the same capacitance value so that the capacitance measured at the UNIT DAC output terminal, $C_{dac}$, will be ½ of a single feedback capacitor value. Therefore, if capacitors $C_{dacp}$ and $C_{dacn}$ are selected to be the same capacitance value the relationship between $C_{dacp}$, $C_{dacn}$ and $C_{dac}$ may be expressed as:

$$C_{dac} = \frac{1}{2} C_{dacp} = \frac{1}{2} C_{dacn} \text{ OR } 2C_{dac} = C_{dacp} = C_{dacn} \quad \text{Eq (8)}$$

Figure 6:
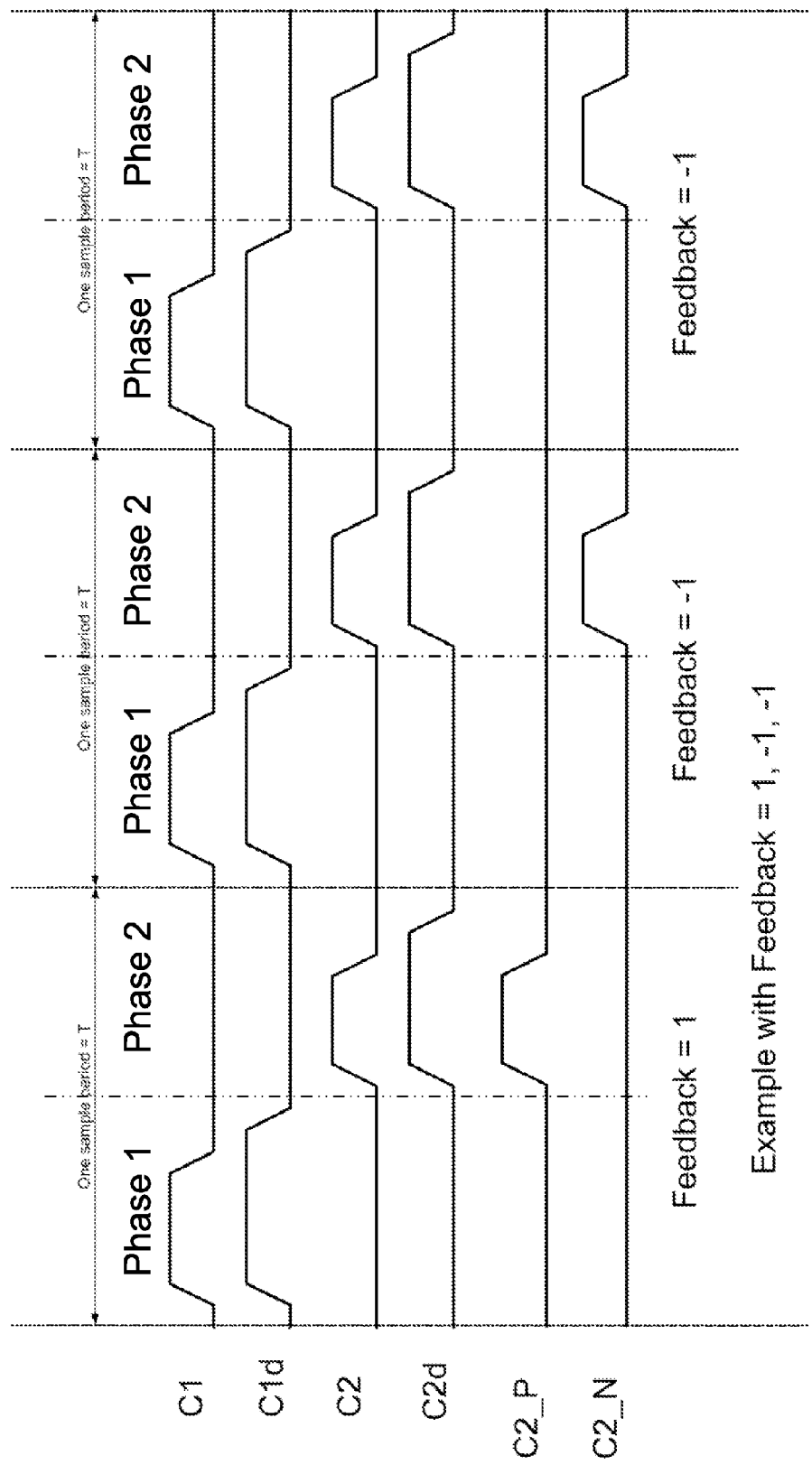
FIG. 6 shows exemplary switch control clock signals for switches C1, C1d, C2d, C2_P, and C2_N.

FIG. 6 shows the switch control clock signals for switches C1, C1d, C2d, C2_P, and C2_N shown in FIG. 5 based on a exemplary digital feedback sequence of [+1, −1, −1] from the quantizer circuit 205 shown in FIG. 1. A high signal on the switch control signal diagram indicates that the corresponding switch is in an electrically connected state, or as commonly referred to as "closed". A low signal on the switch control signal diagram indicates that the corresponding switch is in an electrically disconnected state, or as commonly referred to as "open".

Figure 7:
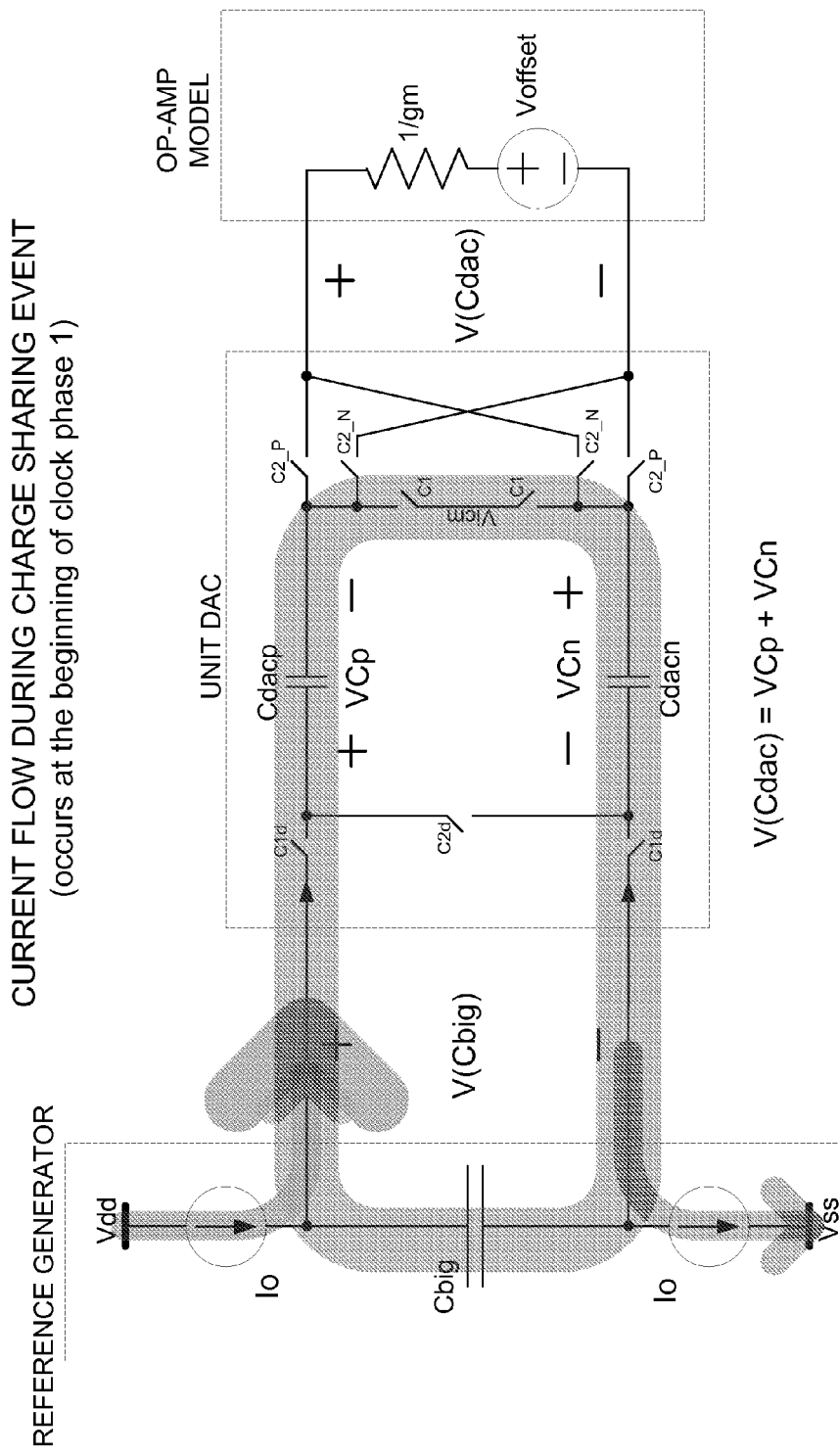
FIG. 7 shows the current flow from "reservoir" $C_{big}$ to capacitors $C_{dacp}$ and $C_{dacn}$ during the charge sharing event in the beginning of phase 1.

FIG. 7 shows the direction of charge flow during phase 1 when the feedback value is +1. During phase 1 switches C1 and C1d are closed and switches C2d, C2_P, and C2_N are open. This switching configuration provides charge to flow from reservoir capacitor $C_{big}$ to capacitors $C_{dacp}$ and $C_{dacn}$. This switching configuration also provides charge to flow from the current source Io to capacitors $C_{dacp}$ and $C_{dacn}$. The charge flow from reservoir capacitor $C_{big}$ to capacitors $C_{dacp}$ and $C_{dacn}$ during the beginning of this phase is highlighted in FIG. 7. During the beginning of phase 1, during the charge sharing event, a large amount of charge is transferred from $C_{big}$ over a short duration and applied to capacitors $C_{dacp}$ and $C_{dacn}$. This provides quick charging of $C_{dacp}$ and $C_{dacn}$ without the use of any external power source which may reduce the noisefloor due to the use of an entirely passive circuit.

Figure 8:
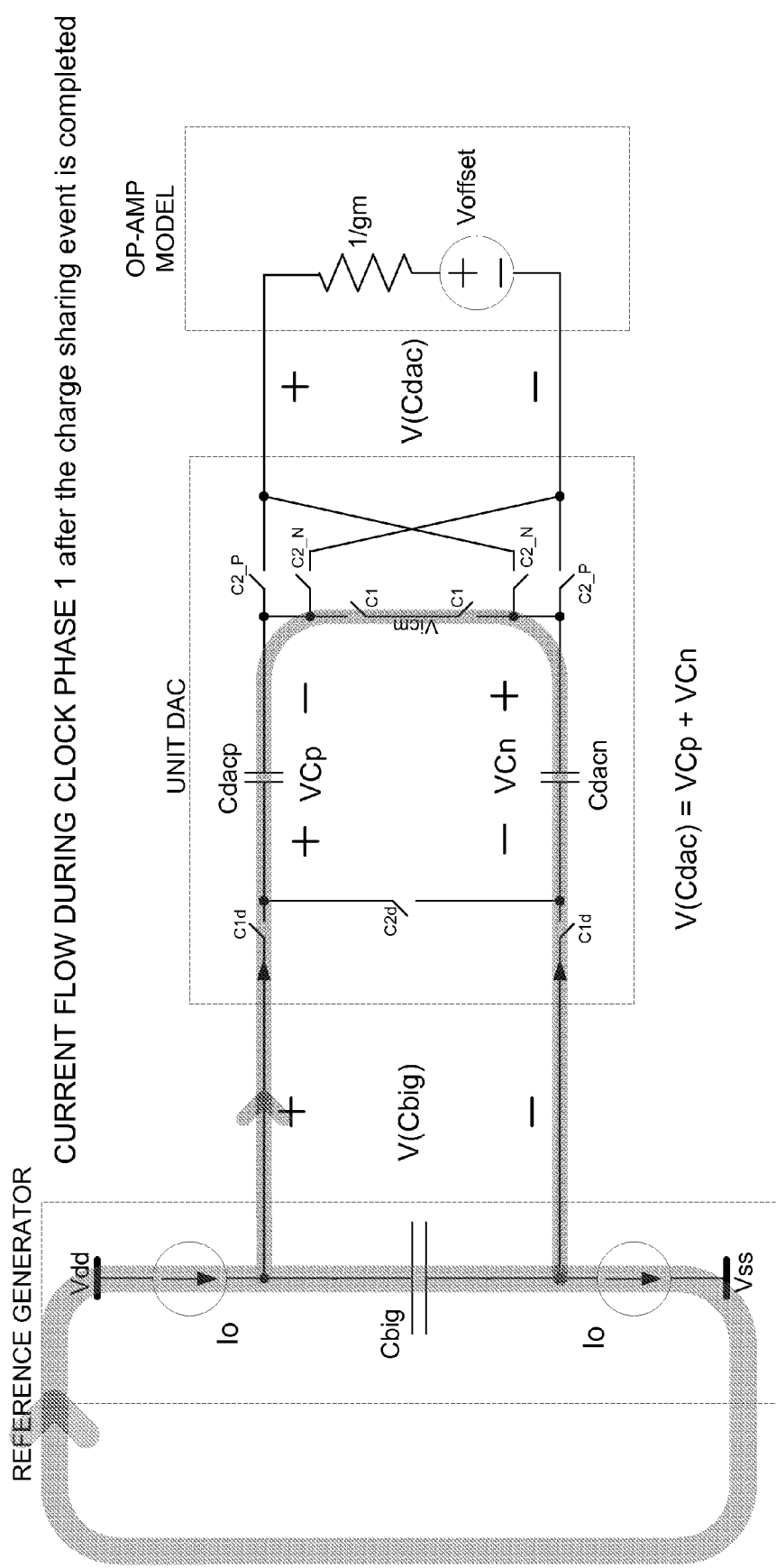
FIG. 8 shows the current flow from the current source Io to capacitors $C_{big}$, $C_{dacp}$, and $C_{dacn}$ during the remainder of phase 1 after the charge sharing event.

FIG. 8 shows the charge flow during phase 1 after the charge sharing even is completed. The charge flow from the current source Io to capacitors $C_{big}$, $C_{dacp}$ and $C_{dacn}$ during the remainder of this phase. During the remainder of phase 1, after the charge sharing event, a small current is provided to slowly refill the charge in $C_{big}$ as well as provide additional charge to capacitors $C_{dacp}$ and $C_{dacn}$.

Figure 9:
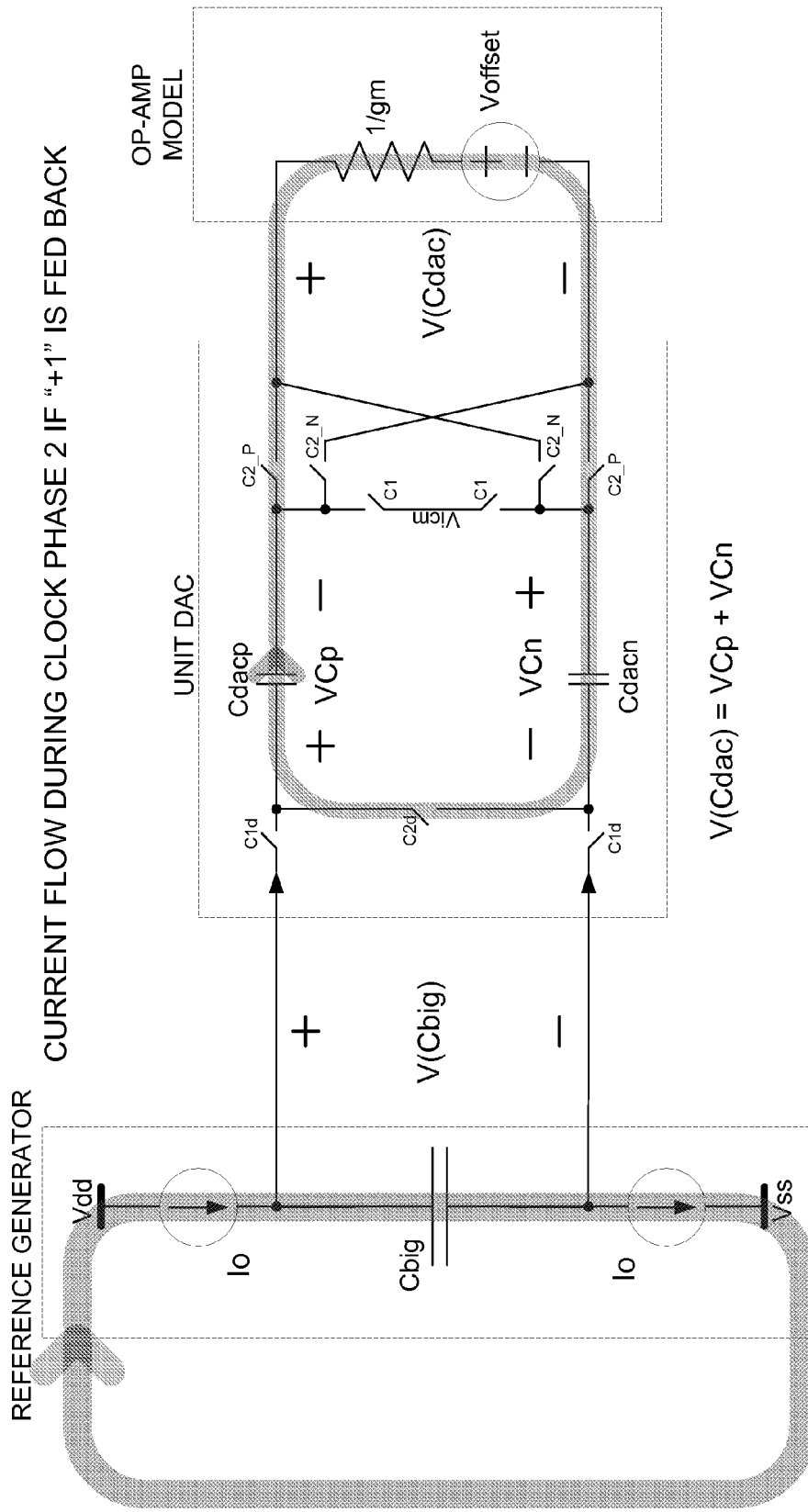
FIG. 9 shows the "refilling" or recharging of "reservoir" capacitor $C_{big}$ by differential current source Io during phase 2; and the positive integration of the charge stored in capacitors $C_{dacp}$ and $C_{dacn}$ to the integrating OTA 601 circuit through switches C2_P during phase 2.

FIG. 9 shows the charge flow during phase 2 of the first sampling period when the feedback value is +1. In phase 2 of the first sampling period after the charge sharing event when capacitors $C_{dacp}$ and $C_{dacn}$ have been charged, switches C1 and C1d are opened, switches C2d and C2_P are closed and switches C2_N remain open. Two circuit operations are performed during this switching phase. First the "reservoir" capacitor $C_{big}$ is further "refilled" or recharged by the differential current source Io. Second, the charge stored in capacitors $C_{dacp}$ and $C_{dacn}$ is positively applied to the integrating OTA 601 circuit through switches C2_P. The "refilling" or recharging of reservoir capacitor $C_{big}$ by differential current source Io during phase 2 is shown in FIG. 9. FIG. 9 also shows the positive application of charge stored in capacitors $C_{dacp}$ and $C_{dacn}$ to the integrating OTA 601 circuit through switches C2_P during phase 2. Throughout the duration of phase 2 capacitor $C_{big}$ is slowly refilled by differential current source Io at a rate of Io/$C_{big}$. Meanwhile during phase 2 capacitors $C_{dacp}$ and $C_{dacn}$ are positively discharged into the integrating OTA 601 circuit connected to the Unit DAC output through switch C2_P.

During phase 1 of the second sampling period when the feedback value is −1, switches C1 and C1d are closed and switches C2d, C2_P, and C2_N are open. This switching configuration provides charge to flow from $C_{big}$ to capacitors $C_{dacp}$ and $C_{dacn}$ which provides the charge flow as shown in FIG. 7. During the beginning of phase 1, the current sharing event, a large current is provided from $C_{big}$ over a short duration and applied to capacitors $C_{dacp}$ and $C_{dacn}$. During the remainder of phase 1, after the current sharing event, a small current is provided to slowly refill the charge in $C_{big}$ as well as provide charge to capacitors $C_{dacp}$ and $C_{dacn}$ as shown in FIG. 8.

Figure 10:
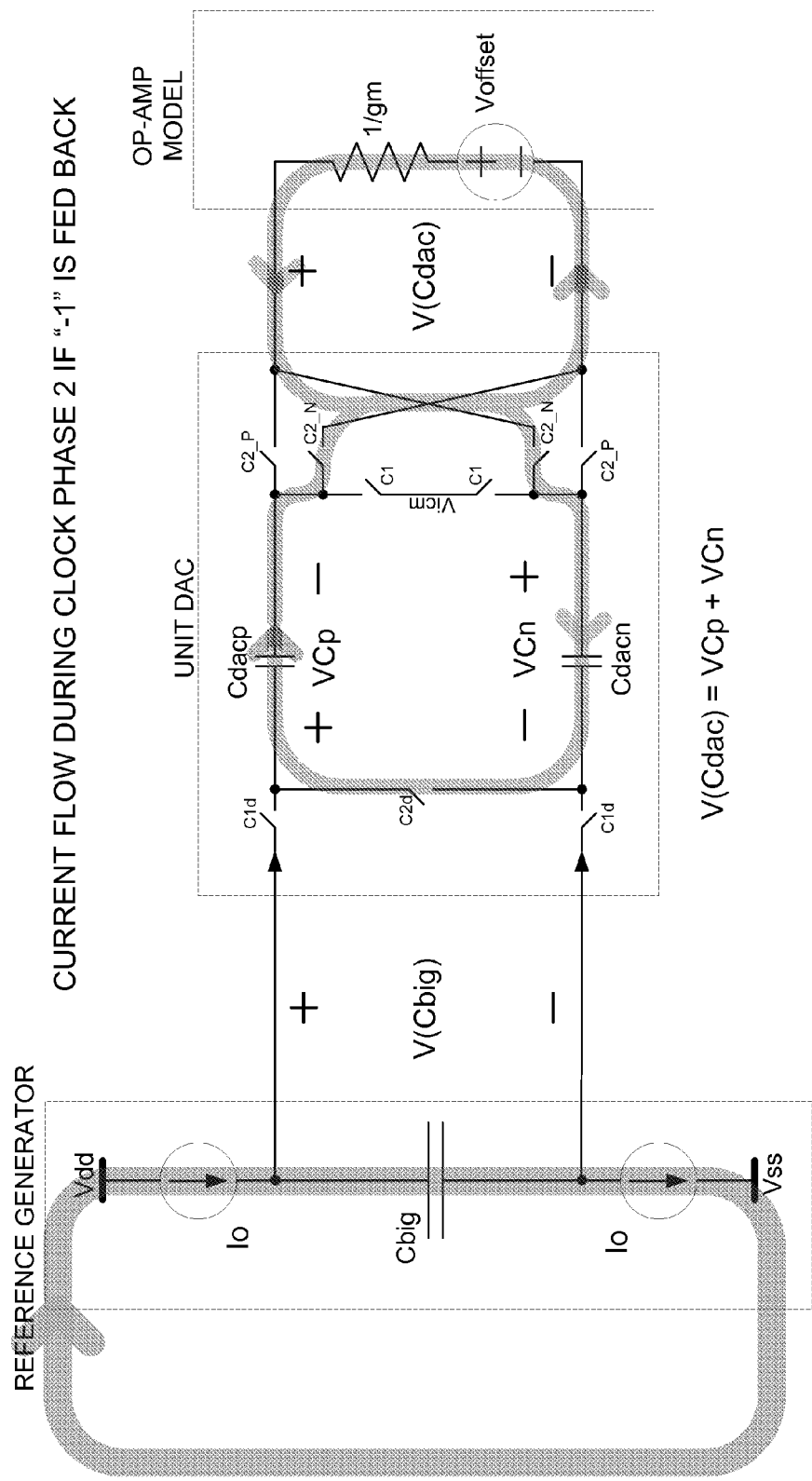
FIG. 10 shows the "refilling" or recharging of "reservoir" capacitor $C_{big}$ by differential current source Io and the negative integration of the charge stored in capacitors $C_{dacp}$ and $C_{dacn}$ to the integrating OTA 601 circuit through switches C2_N during phase 2.

FIG. 10 shows charge flow during phase 2 during the second sampling period when the feedback value is −1. In phase 2 of the second sampling period shown in FIG. 6, after capacitors $C_{dacp}$ and $C_{dacn}$ have been charged, switches C1 and C1d are opened, switches C2d and C2_N are closed and switches C2_P remain open. Two circuit operations are performed during this switching phase. First the reservoir capacitor $C_{big}$ is refilled by the differential current source Io. Second, the charge stored in capacitors $C_{dacp}$ and $C_{dacn}$ is negatively applied to the integrating OTA 601 circuit through switches controlled by signal C2_N. The "refilling" or recharging of reservoir capacitor $C_{big}$ by differential current source Io during phase 2 is shown in FIG. 10. FIG. 10 also shows the negative application of charge stored in the capacitors $C_{dacp}$ and $C_{dacn}$ to the integrating OTA 601 circuit connected to the Unit DAC output through switches C2_N2. Throughout the duration of phase 2, capacitor $C_{big}$ is slowly refilled by the differential current source Io at a rate of Io/$C_{big}$. Meanwhile, during phase 2 capacitors $C_{dacp}$ and $C_{dacn}$ are negatively discharged into the integrating OTA 601 circuit connected to the Unit DAC output through switch C2_N.

The third period with a −1 feedback value shown in FIG. 6 will result in the same switching sequence described above regarding the second sampling period with a −1 feedback value.

Figure 11:
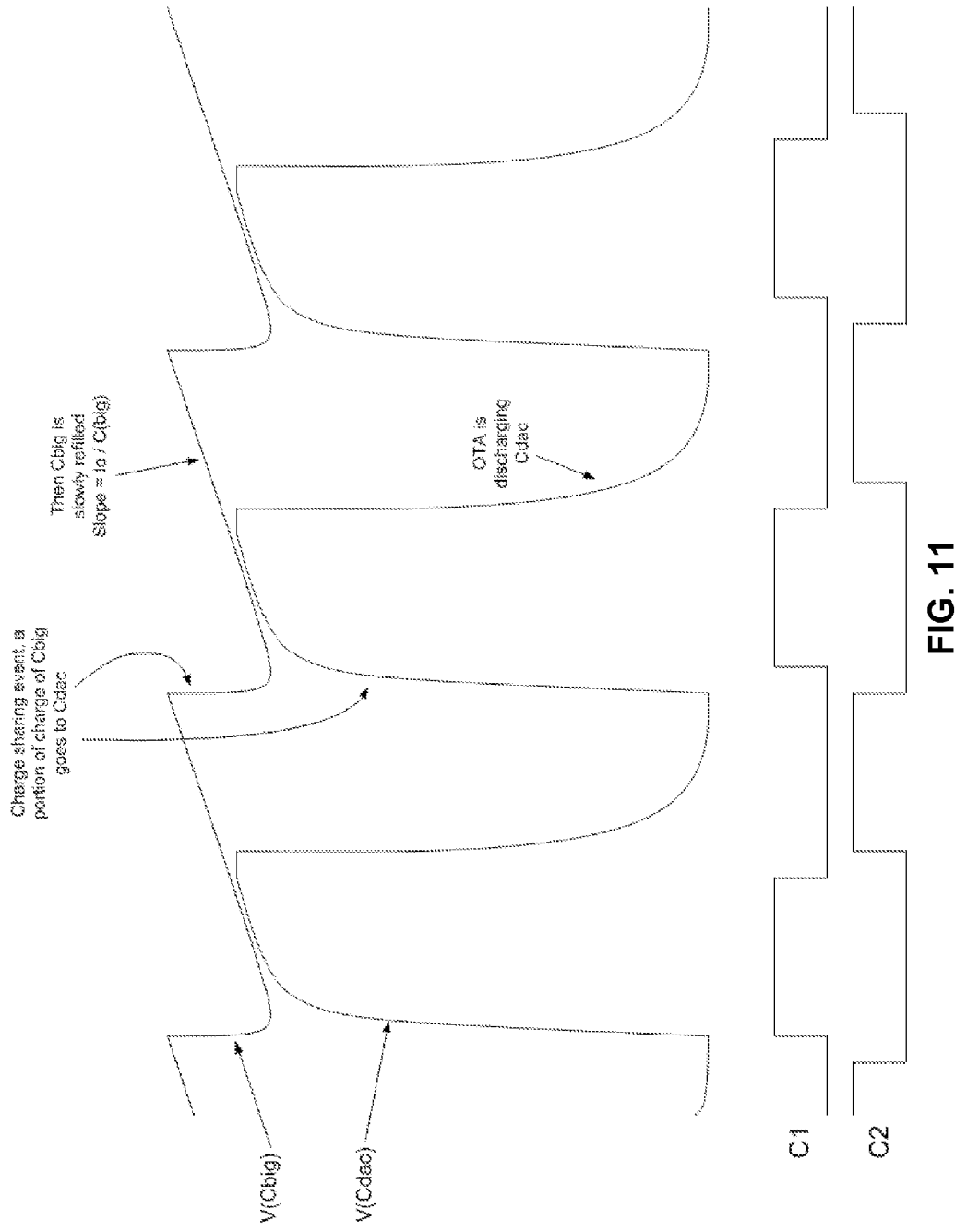
FIG. 11 shows a graph described the charging and discharging sequence of reservoir capacitor $C_{big}$ and capacitors $C_{dacp}$ and $C_{dacn}$.

FIG. 11 shows the waveforms of the voltage created across capacitors $C_{big}$ and $C_{dac}$ during the switch sequence described above. The voltage across reservoir capacitor $C_{big}$ is refilled at a rate of Io/$C_{big}$. Once switch C1 is closed the charge sharing event begins and a portion of the charge stored in $C_{big}$ is transferred to capacitors $C_{dacp}$ and $C_{dacn}$, which combine in series to form $C_{dac}$. When the charge sharing event ends and capacitors $C_{dacp}$ and $C_{dacn}$ maintain their charged state and $C_{big}$ begins to refill at a rate of Io/$C_{big}$. Then when switch C2 closes the charge stored in capacitors $C_{dacp}$ and $C_{dacn}$ is discharged into the integrating OTA 601 output circuit and reservoir capacitor $C_{big}$ continues to refill with additional charge.

Figure 12:
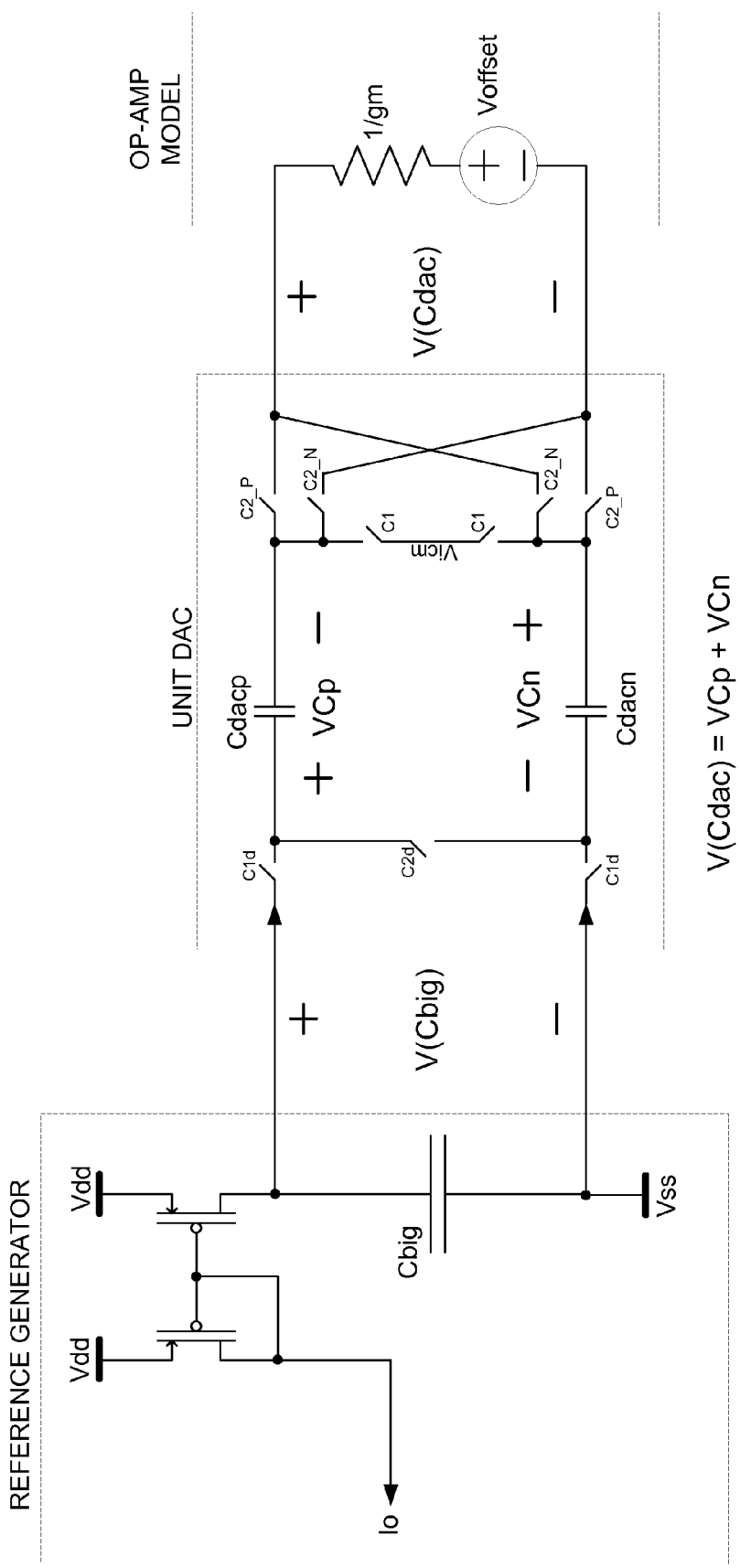
FIG. 12 shows a single ended current mirror configuration with an Io direct-current reference source.

FIG. 12 shows a schematic diagram of a design of a single ended MOSFET current mirror circuit to implement the Io current source shown in FIG. 5. A DC reference current, Io, is provided to the current mirror input. The DC reference current may be created using a bandgap voltage circuit in conjunction with a voltage to current converter circuit. This single ended current mirror configuration may be utilized to provide a single ended current flow.

Figure 13:
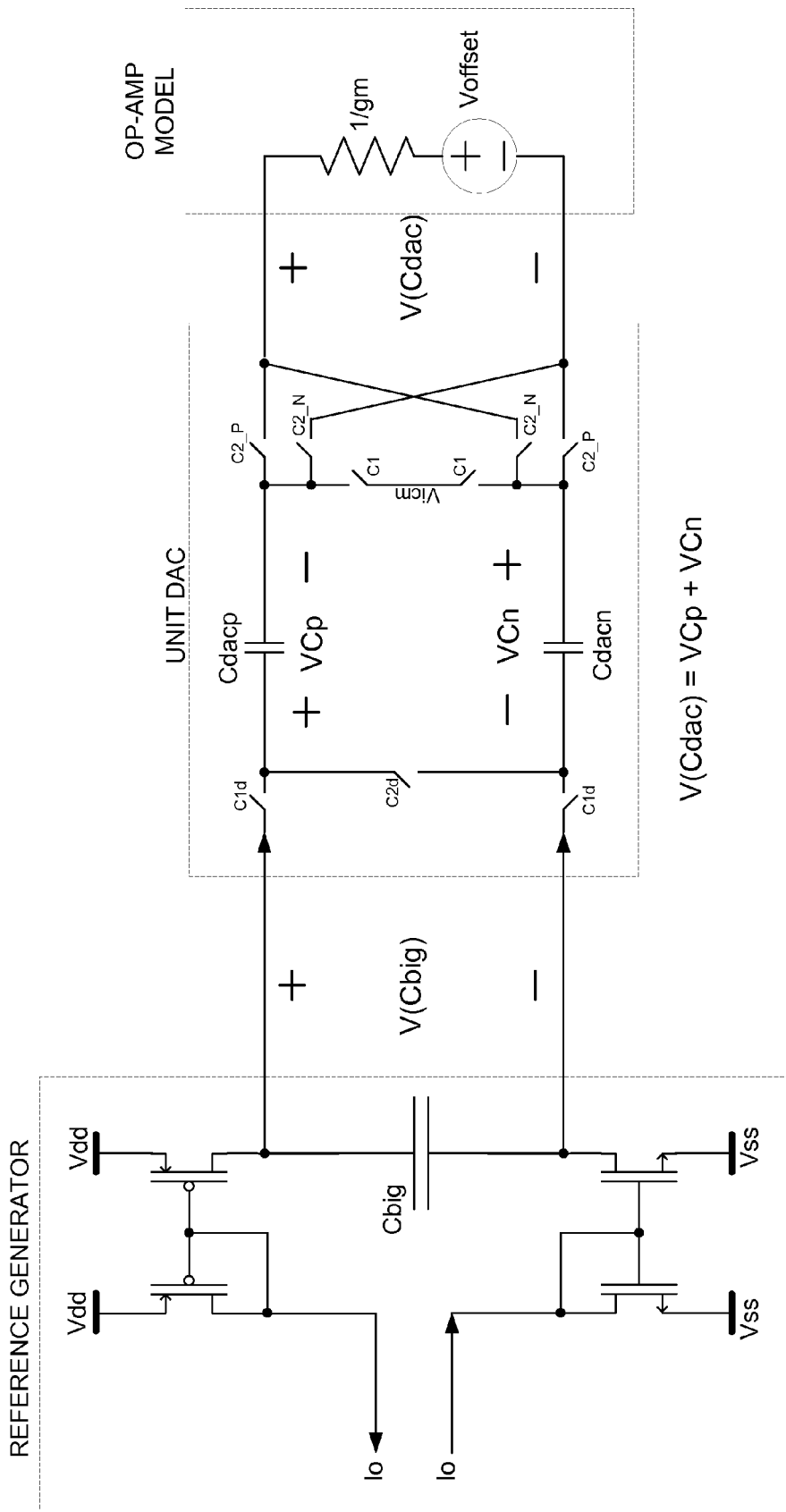
FIG. 13 shows differential current mirror configuration with an Io direct-current reference source.

FIG. 13 shows a schematic diagram of a design of a differential MOSFET current mirror circuit to implement the Io current source shown in FIG. 5. A DC reference current, Io, is provided to the current mirror inputs. The DC reference currents may be created using a bandgap voltage circuit in conjunction with a voltage to current converter circuit. This single ended current mirror configuration may be utilized to provide a single ended current flow. This differential current mirror configuration may provide current symmetry. Achieving current symmetry provides improved noise immunity such as improved immunity from common mode noise being converted to differential noise.

FIG. 14 discloses an improved method and apparatus for implementing a current source within a DAC reference circuit. A very low (or so called "zero") VT n-type field effect transistor (NFET) source follower M0 may be used to provide current flow. A "Zero-Vt" NFET is available in many CMOS processing technologies and has a different channel implant diffusion such that a much lower gate voltage (VT) is required to turn on the device (and hence form the channel) as compared to a standard NFET. This lower VT requirement may provide additional head room for the voltage across reservoir capacitor $C_{big}$.

The voltage $V_{ref}$ may be generated using a bandgap voltage circuit. The source follower transistor M0 may be biased with very low current so that its output impedance (1/gm) remains reasonably high so that it will still act as a current source. To match the impedance of both terminals of another similar type zero-VT NFET, M1 may be used and sized such that the gds of M1 matches the gm of M0, where gm is the transconductance of transistor M0 and gds is the drain-source conductance of transistor M1.

FIG. 15 shows a schematic diagram of a design of the reference circuit described in FIG. 14 with the addition of a slow feedback loop. A differential difference amplifier (DDA) may be used to drive the difference between the actual and desired reference current to a minimal value. A DDA amplifier may use both inverting and non-inverting inputs with a gain of one to produce an output equal to the difference between the inputs. The DDA measures both the voltage present across the terminals of $C_{big}$ as well as $V_{ref}$ and $V_{ss}$. An additional compensation capacitor $C_{comp}$ may be connected from the output of the DDA to $V_{ss}$ to provide additional lowpass filtering of unwanted noise signals present at the output node of the DDA which is connected to the gate of "zero" VT NFET source follower M0.

FIG. 16 shows a flow diagram for the DAC reference circuit operation in the presence of a +1 feedback value. First the reservoir capacitor is charged to a reference voltage level and connected to DAC feedback capacitors (blocks 510 & 520). The charge stored in the reservoir capacitor is then transferred to the DAC feedback capacitors (block 530). The reservoir capacitor is disconnected from the DAC feedback capacitors once the charge has been transferred to the DAC feedback capacitors from the reservoir capacitor (block 540). The DAC feedback capacitors are then positively connected to the DAC output terminals (block 550). The charge stored in the DAC feedback capacitors are then positively transferred to the DAC output terminals (block 560).

Figure 17:
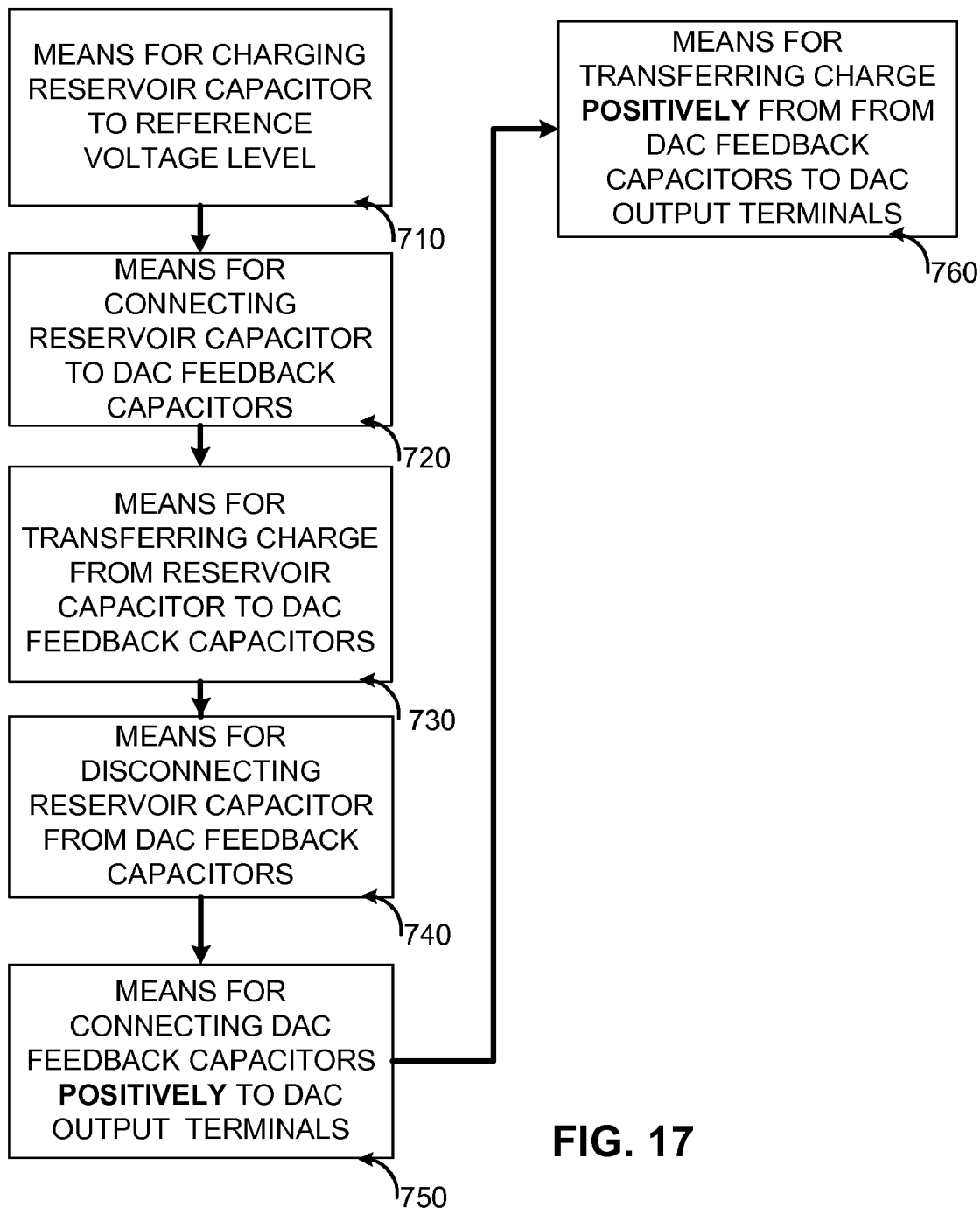
FIG. 17 is a means plus function flow chart of a DAC reference circuit operation when the feedback value is +1.

FIG. 17 shows a means plus function flow diagram for the DAC reference circuit operation in the presence of a +1 feedback value.

Figure 18:
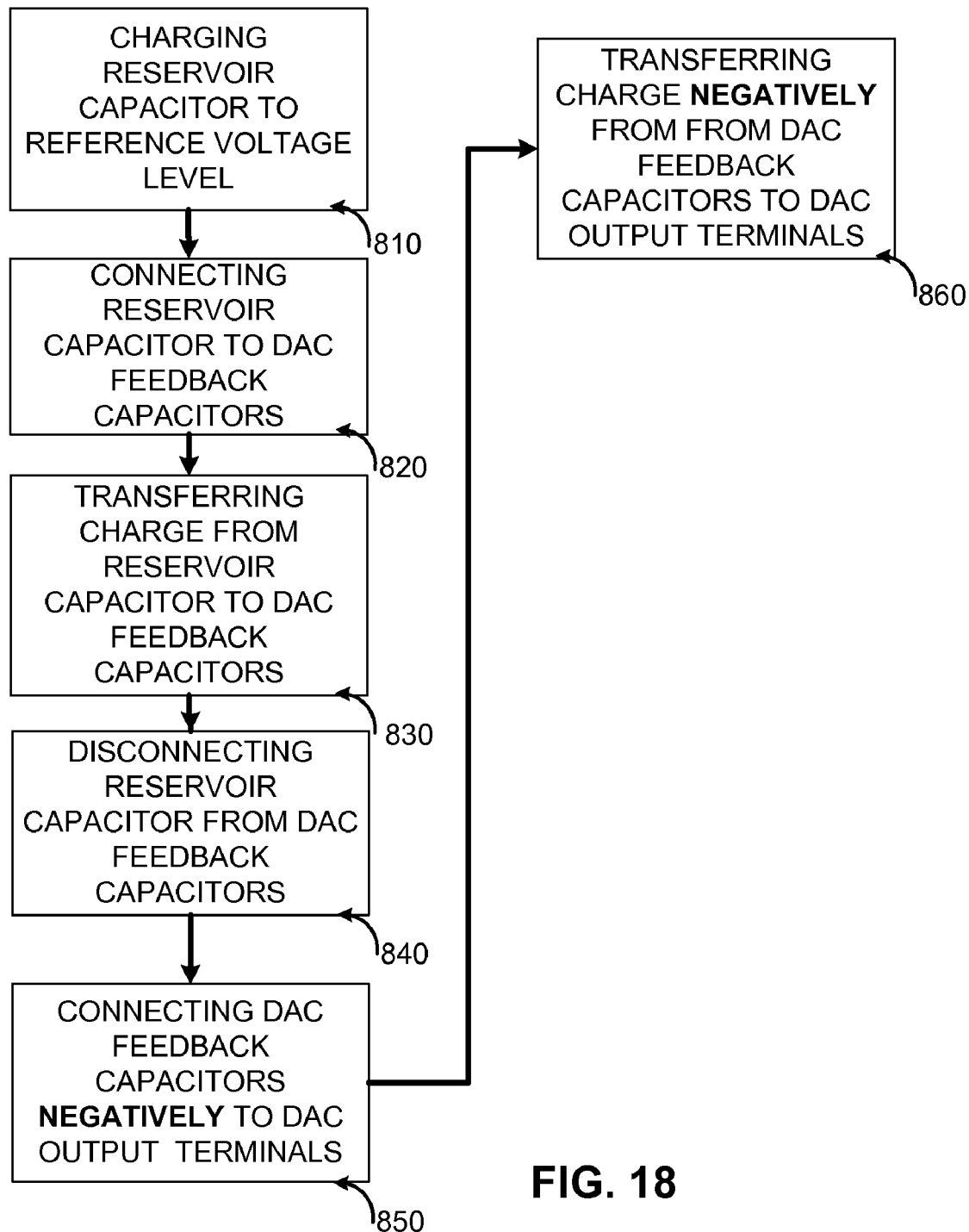
FIG. 18 is a flow chart of a DAC reference circuit operation when the feedback value is −1.

FIG. 18 shows a flow diagram for the DAC reference circuit operation in the presence of a −1 feedback value. First the reservoir capacitor is charged to a reference voltage level and connected to DAC feedback capacitors (blocks 810 & 820). The charge stored in the reservoir capacitor is then transferred to the DAC feedback capacitors (block 830). The reservoir capacitor is disconnected from the DAC feedback capacitors once the charge has been transferred to the DAC feedback capacitors from the reservoir capacitor (block 840). The DAC feedback capacitors are then negatively connected to the DAC output terminals (block 850). The charge stored in the DAC feedback capacitors are then negatively transferred to the DAC output terminals (block 860).

Figure 19:
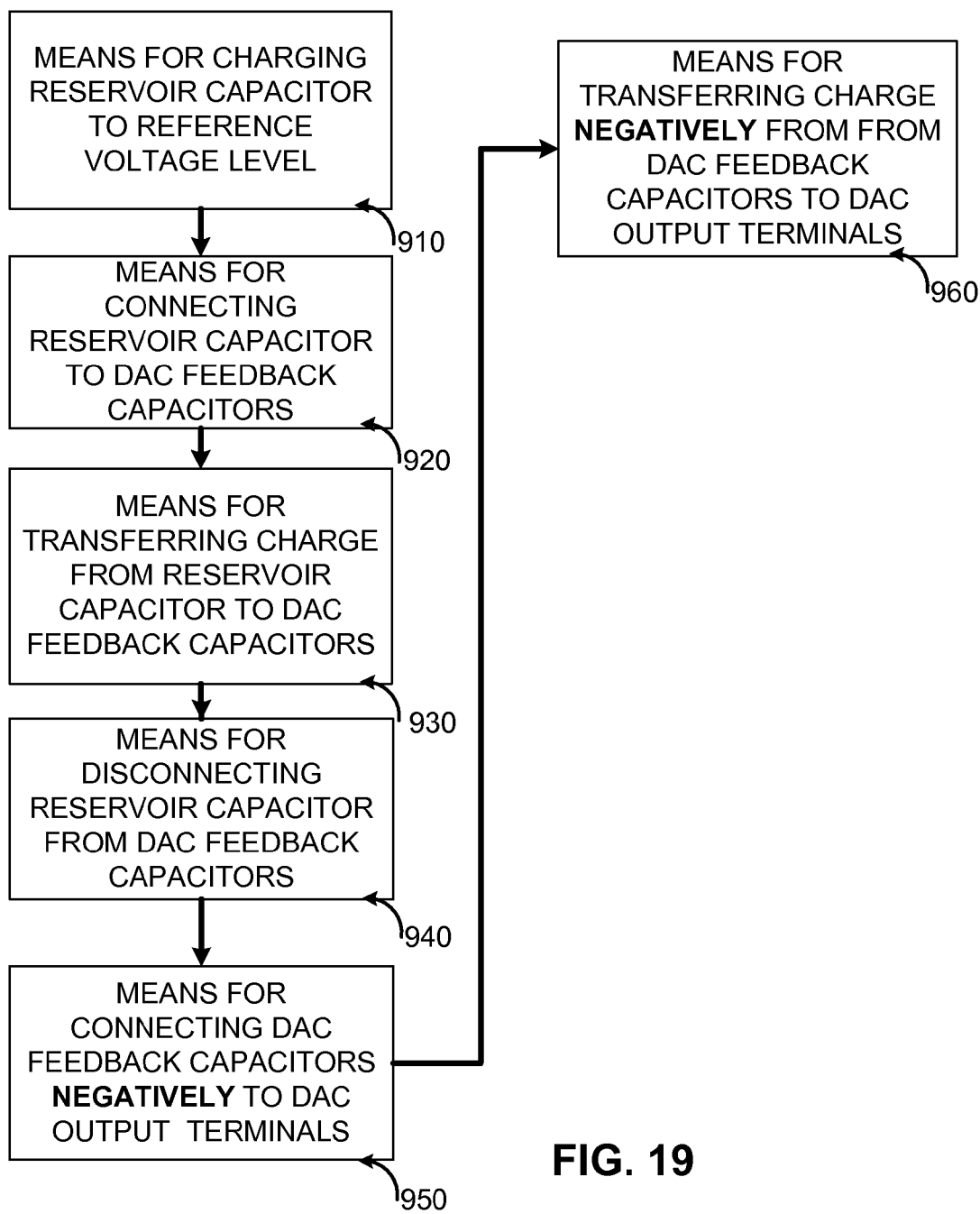
FIG. 19 is a means plus function flow chart of a DAC reference circuit operation when the feedback value is −1.

FIG. 19 shows a means plus function diagram for the DAC reference circuit operation in the presence of a −1 feedback value.

Many benefits are realized by use of the above mentioned improved methods and apparatuses for providing a DAC reference circuit. For example, a high dynamic range DAC may require large feedback capacitors $C_{dacp}$ and $C_{dacn}$ to provide large amounts of charge quickly. Use of a resistive DAC reference circuit, as shown in FIG. 3 and FIG. 4, will result in a large resistor capacitor time constant when large feedback capacitors are used. However, use of a reservoir capacitor $C_{big}$, as described in the present application, effectively reduces the resistor capacitor time constant limitation of the DAC circuit by minimizing the use of resistive elements. It is noted that larger switches may be utilized to provide a smaller "on resistance" of the switch to further improve the time constant limitation without suffering any penalty in power consumption. Thus, the improved DAC reference circuit of the present application may provide a higher dynamic range DAC circuit without suffering a resistor capacitor time constant penalty.

A decrease in power consumption is another benefit which may be realized from utilizing the improved methods and apparatuses for providing a DAC reference circuit as described in the present application. For example, DAC reference circuits utilizing resistor networks, as shown in FIG. 3 and FIG. 4, may require the use of resistors with small resistance values in order to provide the desired reference voltage to the Unit DAC input. The use of resistors with small resistance values may result in high supply current resulting from applying a fix supply voltage across the small resistance circuit. However, the current consumption may be decreased by use of a reservoir capacitor as described in the present application. The improved DAC reference circuit utilizing a reservoir capacitor limits the supply current used by only collecting the charge necessary to supply the DAC feedback capacitors. Thus, reducing power consumption toward the minimum amount of power required to charge the DAC feedback capacitors.

Inherent low pass filtering is another benefit which may be realized from utilizing the improved methods and apparatuses for providing a DAC reference circuit as described in the present application. The reservoir capacitor as described in the present application inherently acts as a low pass filter connected to the positive and negative inputs of the Unit DAC circuit. This configuration may provide the added benefit of filtering out noise signals present at the input of the Unit DAC circuit. There are many noise signals present in an integrated circuit which can be reduced by low pass filtering. For example, there may be power supply noise, ground plane noise, substrate noise, switching noise from nearby circuitry, etc. The inherent low pass filtering characteristic of the disclosed reservoir capacitor may improve overall DAC performance by filtering out and thus reducing the impact of these noise sources.

The ability to achieve high dynamic range DAC without the need for high speed active circuits is another benefit which may be realized from utilizing the improved methods and apparatuses for providing a DAC reference circuit as described in the present application. High speed active circuits may degrade DAC noise performance by injecting additional noise into the DAC circuit. However, use of the improved methods and apparatuses disclosed in the present application may remove the need to use high speed active circuits thus improving the overall noise performance of the DAC circuit.

Reduction of 1/f noise or "pink noise" is another benefit which may be realized from utilizing the improved methods and apparatuses for providing a DAC reference circuit as described in the present application. 1/f noise or "pink noise" may be reduced due to the reduction in DC current utilized by the DAC reference circuit. Current sources may be implemented using MOSFET transistors which exhibit 1/f noise proportional to the DC operating current passing through the MOSFET transistor. Thus, the decrease in supply current utilized by the improved DAC reference circuit disclosed in the present application may also result in a reduction of the 1/f noise created in the MOSFET transistors which are utilized to create the current sources within the DAC circuit. This reduction in 1/f noise may result in lower circuit noise and thus improved noise performance of the DAC circuit.

The low power, low noise digital-to-analog converter reference circuit described herein may be implemented on an IC and RF IC (RFIC), a mixed-signal IC, an application specific integrated circuit (ASIC), a printed circuit board (PCB), an electronics device, etc. The programmable gain circuit may also be fabricated with various IC process technologies such as complementary metal oxide semiconductor (CMOS), N-channel MOS (N-MOS), P-channel MOS (P-MOS), bipolar junction transistor (BJT), bipolar-CMOS (BiCMOS), silicon germanium (SiGe), gallium arsenide (GaAs), etc.

An apparatus implementing the low power, low noise digital-to-analog converter reference circuit described herein may be a stand-alone device or may be part of a larger device. A device may be (i) a stand alone IC, (ii) a set of one or more ICs that may include memory ICs for storing data and/or instruction, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
a capacitor connected to a current source;
a positive terminal of said capacitor connected to a first switch, said first switch electrically connecting said positive terminal of said capacitor to a positive input terminal of a DAC circuit; and
a negative terminal of said capacitor connected to a second switch, said second switch electrically connecting said negative terminal of said capacitor to a negative input terminal of said DAC circuit.

2. The apparatus of claim 1, comprising a plurality of said DAC circuits operably connected in parallel.

3. The apparatus of claim 1, wherein said current source is a single ended current source.

4. The apparatus of claim 1, wherein said current source is a differential current source.

5. The apparatus of claim 3, wherein said current source is a single ended MOSFET current mirror circuit.

6. The apparatus of claim 3, wherein said current source is a Low VT NFET source follower circuit comprising:
a Low VT NFET transistor comprising a gate, drain and source terminal, said drain terminal connected to a positive power supply, said gate terminal connected to a reference voltage, said source terminal connected to said positive terminal of said capacitor.

7. The apparatus of claim 4, wherein said current source is a differential MOSFET current mirror circuit.

8. The apparatus of claim 4, wherein said current source is a differential Low VT NFET source follower circuit comprising:
a first Low VT NFET transistor comprising a gate, drain and source terminal, said drain terminal connected to a positive power supply, said gate terminal connected to a first reference voltage and said source terminal connected to said positive terminal of said capacitor; and
a second Low VT NFET transistor comprising a gate, drain and source terminal, said drain terminal connected to said negative terminal of said capacitor, said gate terminal connected to a second reference voltage and said source terminal connected to a negative power supply.

9. The apparatus of claim 8, wherein a transconductance of said first Low VT NFET transistor is matched to a drain to source conductance of said second Low VT NFET transistor.

10. The apparatus of claim 8, wherein a slow feedback circuit is connected to said gate terminal of said first Low VT NFET source follower circuit, said slow feedback circuit comprising:
a differential difference amplifier circuit, said differential difference amplifier circuit comprising:
an inverting input; and
a non-inverting input, one input configured to measure a voltage across said capacitor, and the other input configured to measure a reference voltage.

11. The apparatus of claim 10, wherein output of said differential difference amplifier is connected to a positive terminal of a compensation capacitor, said compensation capacitor further comprising a negative terminal connected to a signal ground node.

12. A method for converting digital code to an analog signal, comprising:
charging a reservoir capacitor connected to a current source to a reference voltage level;
transferring stored charge from said reservoir capacitor to DAC feedback capacitors; and
transferring said stored charge from said DAC feedback capacitors to DAC output terminals.

13. The method of converting digital code to an analog signal according to claim 12, wherein said step of transferring said stored charge from said DAC feedback capacitors to said DAC output terminals comprises connecting said DAC feedback capacitors negatively to said DAC output terminals.

14. The method of converting digital code to an analog signal according to claim 12, wherein said step of transferring said stored charge from said DAC feedback capacitors to said DAC output terminals comprises connecting said DAC feedback capacitors positively to said DAC output terminals.

15. The method according to claim 12, further comprising continuous refilling of charge in said reservoir capacitor.

16. The method of converting digital code to an analog signal according to claim 13, wherein said step of transferring said stored charge from said DAC feedback capacitors to said DAC output terminals comprises:
connecting said DAC feedback capacitors positively to said DAC output terminals; and
connecting said DAC feedback capacitors negatively to said DAC output terminals.

17. The method of converting digital code to an analog signal according to claim 16, further comprising:
extending said method of converting digital code to an analog signal to more than two DAC levels, whereby said digital to analog converters are connected in parallel.

18. The method according to claim 16, further comprising continuous refilling of charge in said reservoir capacitor.

19. The method of converting digital code to an analog signal according to claim 16, further comprising:
connecting said reservoir capacitor to DAC feedback capacitors;
disconnecting said reservoir capacitor from said DAC feedback capacitors;
connecting said DAC feedback capacitors to said DAC output terminals; and
disconnecting said DAC feedback capacitors from said DAC output terminals.

20. A means for converting digital code to an analog signal, comprising:
means for charging a reservoir capacitor connected to a current source to a reference voltage level;
means for transferring stored charge from said reservoir capacitor to DAC feedback capacitors; and
means for transferring said stored charge from said DAC feedback capacitors to DAC output terminals.

21. The means for converting digital code to an analog signal according to claim 20, wherein said means for transferring said stored charge from said DAC feedback capacitors to said DAC output terminals comprises:
means for connecting said DAC feedback capacitors positively or negatively to said DAC output terminals.

22. The means for converting digital code to an analog signal according to claim 20, further comprising refilling said reservoir capacitor.

23. The means for converting digital code to an analog signal according to claim 21, wherein said means for transferring said stored charge from said DAC feedback capacitors to said DAC output terminals comprises:
means for connecting said DAC feedback capacitors positively to said DAC output terminals; and
means for connecting said DAC feedback capacitors negatively to said DAC output terminals.

24. The means for converting digital code to an analog signal according to claim 23, further comprising means for refilling said reservoir capacitor.

25. The means for converting digital code to an analog signal according to claim 24, further comprising:
means for connecting said reservoir capacitor to DAC feedback capacitors;
means for disconnecting said reservoir capacitor from said DAC feedback capacitors;
means for connecting said DAC feedback capacitors to DAC output terminals; and
means for disconnecting said DAC feedback capacitors from said DAC output terminals.

* * * * *